(12) United States Patent
Huang et al.

(10) Patent No.: US 7,904,782 B2
(45) Date of Patent: Mar. 8, 2011

(54) MULTIPLE PROTECTION GROUP CODES HAVING MAXIMALLY RECOVERABLE PROPERTY

(75) Inventors: Cheng Huang, Bellevue, WA (US); Minghua Chen, Redmond, WA (US); Jin Li, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 1032 days.

(21) Appl. No.: 11/684,589

(22) Filed: Mar. 9, 2007

(65) Prior Publication Data

US 2008/0222481 A1    Sep. 11, 2008

(51) Int. Cl.
 *H03M 13/00* (2006.01)
(52) U.S. Cl. ......................................... 714/752; 714/758
(58) Field of Classification Search .................. 714/752, 714/755, 758, 786, 801
See application file for complete search history.

(56) References Cited

U.S. PATENT DOCUMENTS

| | | | |
|---|---|---|---|
| 4,769,818 A | 9/1988 | Mortimer | |
| 6,687,860 B1 | 2/2004 | Iijima et al. | |
| 6,851,082 B1 | 2/2005 | Corbett | |
| 6,877,128 B2 | 4/2005 | Boyer et al. | |
| 6,920,599 B2 | 7/2005 | Kuwamura | |
| 6,968,479 B2 | 11/2005 | Wyatt et al. | |
| 7,003,714 B1 | 2/2006 | Sundaram et al. | |
| 7,103,824 B2 | 9/2006 | Halford | |
| 7,219,289 B2 | 5/2007 | Dickson | |
| 7,484,158 B2* | 1/2009 | Sharon et al. ................. | 714/755 |
| 7,519,898 B2* | 4/2009 | Narayanan et al. ........... | 714/801 |
| 7,627,715 B1 | 12/2009 | Corbett | |
| 7,647,546 B2 | 1/2010 | Lee et al. | |
| 2004/0128587 A1 | 7/2004 | Kenchammana-Hosekote | |
| 2004/0158791 A1 | 8/2004 | Sawaguchi | |
| 2006/0107135 A1 | 5/2006 | Corbett | |
| 2007/0011302 A1 | 1/2007 | Groner | |
| 2008/0069242 A1* | 3/2008 | Xu et al. ................. | 375/240.24 |
| 2008/0168329 A1* | 7/2008 | Han et al. ..................... | 714/764 |

OTHER PUBLICATIONS

Xu et al. Variable Shortened-and-Punctured Reed-Solomon codes for Packet Loee protection. Sep. 2002, ISSS Transaction on broadcasting, vol. 48, No. 3. pp. 237-245.*

Adya, A., W. J. Bolosky, M. Castro, R. Chaiken, G. Cermak, J. R. Douceur, J. Howell, J. R. Lorch, M. Theimer, R. P. Wattenhofer, Farsite: Federated, available, and reliable storage for an incompletely trusted environment, 5th OSDI, Dec. 2002.

Aguilera, M. K., R. Janakiraman, L. Xu, Using erasure codes efficiently for storage in a distributed system, Int'l Conf. on Dependable Sys. and Networks, Jun. 2005, pp. 336-345.

(Continued)

*Primary Examiner* — Sam Rizk
(74) *Attorney, Agent, or Firm* — Lyon & Harr, L.L.P.; Craig S. Fischer

(57) ABSTRACT

A multiple protection group (MPG) erasure-resilient coding method for constructing MPG codes for encoding and decoding data. The MPG codes constructed herein protect data chunks of data in multiple protection groups and subgroups. In general, the MPG erasure-resilient codes are constructed by locating data chunks into multiple protection groups and assigning at least one parity chunk to each protection group. Basic MPG codes are constructed from existing Maximum Distance Separable (MDS) codes by splitting at least some of the parity chunks into local parities for each of the multiple protection groups and projecting local parities onto each of the groups. Generalized MPG codes have a Maximally Recoverable property that can be used to determine whether an erasure pattern is recoverable or unrecoverable. Generalized MPG codes can recover any erasure pattern that is recoverable.

20 Claims, 17 Drawing Sheets

OTHER PUBLICATIONS

Berrou, C., A. Glavieux, P. Thitimajshima, Near Shannon limit error-correcting coding and decoding: Turbo-codes, IEEE Int'l Conf. on Communications, May 1993, vol. 2, pp. 1064-1070.

Blaum, M., J. Brady, J. Bruck, J. Menon, Evenodd: An efficient scheme for tolerating double disk failures in RAID architectures, IEEE Transactions on Comp., Feb. 1995, pp. 192-202, vol. 44, No. 2.

Byers, J. W., M. Luby, M. Mitzenmacher, and A. Rege, A digital fountain approach to reliable distribution of bulk data, Comp. Comm.—Review, 1998, pp. 56-67, vol. 28, No. 4.

Cachin, C., S. Tessaro, Optimal resilience for erasure-coded Byzantine distributed storage, Proc. of the Int'l Conf. on Dependable Sys. and Networks (DSN'06), 2006, pp. 115-124.

Chou, P. A., Y. Wu, and K. Jain, Practical network coding, Proc. of 41st Annual Allerton Conf. on Comm., Control, and Computing, Oct. 2003.

Chun, B.-G., F. Dabek, A. Haeberlen, H. Weatherspoon, M. F. Kaashoek, J. Kubiatowicz, and R. Morris, Efficient replica maintenance for distributed storage systems, Proc. of the 3rd Symposium on Networked Systems Design and Implementation, May 2006, San Jose, CA.

Cooley, J. A., J. L. Mineweaser, L. D. Servi, E. T. Tsung, Software-based erasure codes for scalable distributed storage, Proc. of the 20th IEEE/11th NASA Goddard Conf. on Mass Storage Sys. and Tech. (MSS'03), 2003, pp. 157-164.

Corbett, P., B. English, A. Goel, T. Grcanac, S. Kleiman, J. Leong, S. Sankar, Row-Diagonal Parity for Double Disk Failure Correction, Proc. of the 3rd USENIX Conf. on File and Storage Technologies, 2004, pp. 1-14, San Francisco, CA.

Dabek, F., M. F. Kaashoek, D. Karger, R. Morris, and I. Stoica, Wide-area cooperative storage with CFS, Proc. of the 18th ACM Symposium on Operating Systems Principles, Oct. 2001, pp. 202-215.

Dimakis, A. G., V. Prabhakaran, K. Ramchandran, Decentralized erasure codes for distributed networked storage, IEEE/ACM Transactions on Networking, Jun. 2006, vol. 14, pp. 2809-2816.

Dimakis, A. G., P. B. Godfrey, M. J. Wainwright, K. Ramchandran, Network coding for distributed storage systems, 26th IEEE Int'l Conf. on Comp. Comm., May 2007, pp. 2000-2008.

Druschel, P. and A. Rowstron, Past: A large-scale persistent peer-to-peer storage utility, Proc. of the Eight IEEE Workshop on Hot Topics in Operating Systems (HotOSVIII), Schoss Elmau, Germany, May 2001.

Freundlich, S., D. Burshtein, S. Litsyn, Approximately lower triangular ensembles of LDPC codes with linear encoding complexity, IEEE Transactions on Info. Theory, Apr. 2007, vol. 53, No. 4, pp. 1484-1494.

Ghemawat, S., H. Gobioff, and S.-T. Leung, The Google file system, Proc. of ACM SOSP, Oct. 2003, pp. 96-108.

Hafner, J. L., HoVer erasure codes for disk arrays, Int'l Conf. on Dependable Sys. and Networks (DSN'06), 2006, pp. 217-226.

Hafner, J. L., V. Deenadhayalan, K. K. Rao, J. A. Tomlin, Matrix methods for lost data reconstruction in erasure codes, 4th USENIX Conf. on File and Storage Tech. (FAST '05), 2005, p. 183-196, San Francosco, CA.

Hellerstein, L., G. Gibson, R. Karp, R. Katz, and D. Patterson, Coding techniques for handling failures in large disk arrays, Algorithmica, 1994, vol. 2, No. 3, pp. 182-208.

Huang, C., L. Xu, Star: An efficient coding scheme for correcting triple storage node failures, Proc. 4th USENIX Conf. on File and Storage Techn, pp. 197-210.

Huang, C., C. Minghua, J. Li, Pyramid codes: Flexible schemes to trade space for access efficiency in reliable data storage systems, Sixth IEEE Int'l Symposium on Network Computing and Applications, Jul. 12-14, 2007, pp. 79-86.

Kamra, A., V. Misra, J. Feldman, D. Rubenstein, Growth codes: maximizing sensor network data persistence, Proc. of the 2006 Conf. on Applications, Tech., Architectures, and Protocols for Comp. Comm., 2006, pp. 255-266, Pisa, Italy.

Kubiatowicz, J., D. Bindel, Y. Chen, S. Czerwinski, P. Eaton, D. Geels, R. Gummadi, S. Rhea, H. Weatherspoon, W. Weimer, C. Wells, and B. Zhao, OceanStore: An architecture for global-scale persistent storage, Proc. of the 9th Int'l Conf. on Architectural Support for Programming Languages and Operating Systems, Nov. 2000, pp. 190-201.

Lentmaier, M., and K. S. Ziganfirov, Iterative decoding of generalized low-density parity-check codes, Proc. of IEEE Int'l Symposium on Information Theory, 1998, p. 149.

Plank, J. S., M. G. Thomason, A practical analysis of low-density parity-check erasure codes for wide-area storage applications, Int'l Conf. on Dependable Systems and Networks, Jun. 28-Jul. 1, 2004, pp. 115-124.

Richter, G., S. Stiglmayr, M. Bossert, Optimized asymptotic puncturing distributions for different LDPC code constructions, IEEE Int'l Symposium on Information Theory, Jul. 2006, pp. 831-835.

Xu, L., Hydra: A platform for survivable and secure data storage systems, Proc. of the 2005 ACM Workshop on Storage Security and Survivability, 2005, pp. 108-114.

Xu, L., and J. Bruck, X-Code: MDS array codes with optimal encoding, IEEE Trans. on Information Theory, Jan. 1999, vol. 45, No. 1, pp. 272-276.

Yue, G., L. Ping, X. Wang, Low-rate generalized low-density panty-check codes with hadamard constraints, Proc. Int'l Symposium on Information Theory, Sep. 4-9, 2005, pp. 1377-1381.

Co-pending U.S. Appl. No. 11/684,584, filed Mar. 9, 2007.

Alphonse, F., U.S. Appl. No. 11/684,584, U.S. Office Action, Jul. 8, 2010.

* cited by examiner

| Expectation Value | read overhead | update complexity | data reliability $(1 - 10^x)$ |
|---|---|---|---|
| two-hierarchy (32, 24) | 0.007 | 4 | -11.59 |
| three-hierarchy (32, 24) | 0.005 | 4 | -11.22 |
| MDS code (28, 24) | 0.023 | 4 | -10.02 |

$$G = \begin{bmatrix} 1 & 0 & 0 & 0 & 0 & 0 \\ 0 & 1 & 0 & 0 & 0 & 0 \\ \hline 0 & 0 & 1 & 0 & 0 & 0 \\ 0 & 0 & 0 & 1 & 0 & 0 \\ \hline 0 & 0 & 0 & 0 & 1 & 0 \\ 0 & 0 & 0 & 0 & 0 & 1 \\ \hline * & * & 0 & 0 & * & * \\ * & * & * & * & * & * \\ 0 & 0 & * & * & * & * \end{bmatrix} \xrightarrow{\text{erasure}} \begin{bmatrix} 1 & 0 & 0 & 0 & 0 & 0 \\ - & - & - & - & - & - \\ \hline 0 & 0 & 1 & 0 & 0 & 0 \\ - & - & - & - & - & - \\ \hline - & - & - & - & - & - \\ 0 & 0 & 0 & 0 & 0 & 1 \\ \hline * & * & 0 & 0 & * & * \\ * & * & * & * & * & * \\ 0 & 0 & * & * & * & * \end{bmatrix}$$

$$\xrightarrow{\text{assignment}} \begin{bmatrix} 1 & 0 & 0 & 0 & 0 & 0 \\ * & * & 0 & 0 & * & * \\ \hline 0 & 0 & 1 & 0 & 0 & 0 \\ * & * & * & * & * & * \\ \hline 0 & 0 & * & * & * & * \\ 0 & 0 & 0 & 0 & 0 & 1 \end{bmatrix}$$

FIG. 8

|  | $A_1(l_1 = 2)$ | $A_2(l_2 = 2)$ | $A_3(l_3 = 3)$ |
|---|---|---|---|
| $U_1(p_1 = 3)$ | ?(2) | 0 | ?(1) |
| $U_2(p_2 = 4)$ | 0 | ?(2) | ?(2) |

FIG. 9

RECOVERABLE PATTERN

(FULL SIZE MATCHING DOES EXISTS)

RECOVERABLE PATTERN

UNRECOVERABLE PATTERN

(FULL SIZE MATCHING DOES NOT EXISTS)

UNRECOVERABLE PATTERN algo 1 Generalized Pyramid Codes Construction

1: $\mathbf{G} := I_{k \times k}, \mathbf{U} := I_{k \times k}$
2: for $m = k : n - 1$ do
3:     // $\mathbf{g}_m^{zero}$: true at zero entries
4:     for $t = 0 : k - 1$ do
5:        $\mathbf{g}_m[t] :=$ random value in Galois Field
6:        if $\mathbf{g}_m^{zero}[t] = true$ then
7:           $\mathbf{g}_m[t] := 0$
8:     $\mathbf{gu} :=$ null // $\mathbf{gu}$: all $\mathbf{g}_m \cdot \mathbf{u}_i$
9:     for $j = 0 : |\mathbf{U}| - 1, \mathbf{u}_j \in \mathbf{U}$ do
10:        if $\mathbf{g}_m \cdot \mathbf{u}_j \neq 0$ then
11:           $\mathbf{gu}[j] := \mathbf{g}_m \cdot \mathbf{u}_j$, repeat
12:        if $t = 0 : k - 1$ ($\mathbf{g}_m^{zero}[t] = false$ and $\mathbf{u}_j[t] = 0$) then
13:           $\mathbf{gu}[j] := 0$, repeat
14:        // $\epsilon_{bad}$: all bad $\epsilon$, $\mathbf{uu}$: all $\mathbf{u}_i \cdot \mathbf{u}_j$
15:        $\epsilon_{bad} :=$ null, $\mathbf{uu} :=$ null
16:        for $i = 0 : j - 1$ do
17:           $\mathbf{uu}[i] := \mathbf{u}_i \cdot \mathbf{u}_j$
18:           if $\mathbf{uu}[i] = 0$ then
19:              repeat
20:           $\epsilon_{bad} := \epsilon_{bad} + \{\mathbf{gu}[i]/\mathbf{uu}[i]\}$
21:        $\epsilon =$ random value in $\overline{\epsilon_{bad}}$
22:        // update $\mathbf{g}_m$ and $\mathbf{gu}$
23:        $\mathbf{g}_m := \mathbf{g}_m + \epsilon \mathbf{u}_j$
24:        for $i = 0 : j - 1$ do
25:           $\mathbf{gu}[i] := \mathbf{gu}[i] + \epsilon \mathbf{uu}[i]$
26:        for $t = 0 : k - 1, \mathbf{g}_m^{zero}[t] = true$ do
27:           $\mathbf{g}_m[t] := 0$
28:        $\mathbf{gu}[j] := \mathbf{g}_m \cdot \mathbf{u}_j$
29:     // update $\mathbf{G}$ and $\mathbf{U}$
30:     for $S' = \{k-2 \text{ rows in } \mathbf{G}\}$ do
31:        $S = S' + \{\mathbf{g}_m\}$
32:        if $\text{rank}(S) = k - 1$ then
33:           $\mathbf{U} := \mathbf{U} + \{\mathbf{u}\}$
34:     $\mathbf{G} := \mathbf{G} + \{\mathbf{g}_m\}$
35: return

FIG. 15 algo 2 Calculate Minimum Recovery Cost
---
1: $D :=$ data nodes in Tanner graph
2: $C :=$ parity nodes in Tanner graph
3: $cost := \infty$
4: for $C_s =$ subset of $C$ with size $|D|$ do
5:   if $\exists$ a full size matching between $C_s$ and $D$ then
6:     $cost_0 := |C_s| +$ remaining data chunks connected to $C_s$
7:     $cost = \min(cost, cost_0)$
8: return algo 3 Calculate Minimum Access Cost (one parity subset)

1: $Q :=$ null // queue used for the breadth first search
2: $V_L :=$ null, $V_R :=$ null, $C_L :=$ null
3: $\mathbf{M} :=$ calculate the maximum matching
4: if $|\mathbf{M}|$ less than data erasure number then
5:    return
6: $Q.\text{enqueue}(v)$
7: while $|Q| > 0$ do
8:    $v := Q.\text{dequeue}$
9:    if $v$ is a left node then
10:      if $v \in V_L$ then
11:        repeat
12:      $V_L := V_L + \{v\}$
13:      $Q.\text{enqueue}(\mathbf{M}[v])$
14:    else
15:      $V_R := V_R + \{v\}$
16:      for $v_L :=$ neighbors of $v$ do
17:        if $v_L \notin V_L$ then
18:          $Q.\text{enqueue}(v_L)$
19:        if $v_L \notin C_L$ then
20:          $C_L := C_L + \{v_L\}$
21:      if $|V_L| \leq |V_R|$ and $C_L \subseteq V_L$ then
22:        last // found a recoverable set containing $v$
23: $cost_0 := |V_R| +$ remaining data chunks connected to $V_R$
24: $v.cost := \min(v.cost, cost_0)$
25: return

FIG. 23

MULTIPLE PROTECTION GROUP CODES HAVING MAXIMALLY RECOVERABLE PROPERTY

BACKGROUND

A promising direction in computer storage systems is to harness the collective storage capacity of massive commodity computers to form a large distributed storage system. When designing such distributed storage systems, there are three aspects to consider, namely data reliability, storage cost, and access overhead. The first aspect is data reliability, and individual components of a massive distributed storage system may fail due to a variety of reasons, including hard drive failures, computer motherboard failures, memory problems, network cable problems, loose connections (such as a loose hard drive cable, memory cable, or network cable), power supply problems, and so forth.

Many applications require the distributed storage system to ensure a high data reliability. For example, an online banking application may require the account balance data to have a Mean Time Between Failure (MTBF) of $10^9$ hours. In general, these data reliability requirements are beyond the capability of any single storage component (such as a computer or a hard drive). Therefore, for distributed storage systems to be useful in practice, proper redundancy schemes must be implemented to provide high reliability, availability and survivability. One type of redundancy scheme is replication, whereby data is replicated two or three times to different computers in the system. As long as any one of the replica is accessible, the data is available. Most distributed storage systems use replication for simplified system design and low access overhead.

Another type of redundancy scheme that may be applied to ensure reliability is Erasure Resilient Coding (ERC) techniques. Erasure-resilient codes enable lossless data recovery notwithstanding loss of information during storage or transmission. The basic idea of the ERC techniques is to use certain mathematical transforms and map k original data chunks into n total chunks (data and n-k parity). Note that chunks are of the same size and can be physically mapped to bytes, disk sectors, hard drives and computers, and so forth. When there are no more than n-k failures, all original data can be retrieved (using the inverse of the mathematical transforms). Such ERC techniques are called (n,k) ERC schemes.

Even if redundancy schemes achieve the same data reliability, they can differ significantly in terms of the storage cost and access overhead. For example, in replication schemes data on a failed chunk easily can be accessed through its replica and thus the access overhead is low. However, the storage costs are high because each data chunk is replicated a number of times. Large storage cost directly translates into high cost in hardware (hard drives and associated machines), as well as the cost to operate the storage system, which includes the power for the machine, cooling, and maintenance. It is desirable, therefore, to decrease the storage cost. On the other hand, (n,k) ERC schemes are efficient in terms of storage costs. However, accessing data on a failed data chunk requires the mathematical inverse and involves k other chunks (data+parity). In this sense, the access overhead is significant. In short, given the data reliability requirement there exist trade-offs between the storage cost and the access overhead in the distributed storage system design.

Existing redundancy schemes only allow very coarse exploration of these trade-offs. In particular, the replication schemes and (n,k) ERC schemes represent two extremes of such trade-offs. In contrast, using multiple protection groups to protect multiple data chunks allows free exploration of the trade-offs between the storage cost and the access overhead. Nevertheless, there is a lack of existing erasure-resilient coding techniques that use multiple protection groups to protect multiple data chunks. Note that some error-correction coding techniques do use the concept of different protection groups. However, the design goal for these techniques is for correcting errors, and is radically different from coding techniques in distributed storage systems, which involves correcting erasures. Thus, these techniques are not applicable for distributed storage system applications.

SUMMARY

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The multiple protection group (MPG) erasure-resilient coding method includes methods for constructing a new generic class of erasure-resilient codes that protects chunks of data in multiple protection groups and subgroups. The general MPG erasure-resilient codes are constructed by locating data chunks into multiple protection groups and assigning at least one parity chunk to each protection group.

The MPG erasure-resilient codes form multiple protection groups for data chunks. The MPG code can be used in distributed storage devices. When there are a large number of storage devices, either in a data center or an Internet-wide storage device, protection groups are desirable. The MPG codes disclosed herein use multiple protection groups and at least one parity for each protection group to offer lower access overhead with the same data protection.

At least two types of MPG erasure-resilient codes are discussed. A first type of codes is basic MPG codes. These codes can be constructed straightforwardly from existing Maximum Distance Separable (MDS) codes, and are simple to encode and decode. The basic MPG codes are constructed by splitting at least some of the parity chunks into local parities for each of the multiple protection groups. Each of the local parities is equivalent to the projection of the original parity onto each of the multiple protection groups. A method for decoding data encoded using the basic MPG codes also is discussed.

Another type of MPG erasure-resilient codes is generalized MPG codes. These codes have a Maximally Recoverable property that can be used to determine whether an erasure pattern is recoverable or unrecoverable. The generalized MPG codes with the MR property are constructed through a deterministic construction algorithm on a potentially larger order Galois Field with flexible configurations. In particular, a generalized MPG code is constructed by creating row vectors of its generator matrix, one row at a time. In particular, a null space matrix is constructed to hold all null space vectors of sub-matrices of the generator matrix. A new row vector of the generator matrix is found such that its dot product with any row vector in the null space matrix is not equal to zero. A method for decoding data encoded using the generalized MPG codes also is discussed. It is also shown that the generalized MPG codes can recover any data that is recoverable.

It should be noted that alternative embodiments are possible, and that steps and elements discussed herein may be changed, added, or eliminated, depending on the particular embodiment. These alternative embodiments include alternative steps and alternative elements that may be used, and structural changes that may be made, without departing from the scope of the invention.

DRAWINGS DESCRIPTION

Referring now to the drawings in which like reference numbers represent corresponding parts throughout:

FIG. 8 illustrates a first embodiment of the MR detection technique using atomic assignments.

FIG. 9 is a table illustrating an atomic assignment for the configuration shown in FIG. 7.

FIG. 15 is pseudocode of an exemplary embodiment of the construction method of the generalized MPG codes shown in FIG. 14.

FIG. 23 illustrate in pseudocode exemplary implementation of computing minimum access cost in the decoding of the generalized MPG codes having an MR property.

DETAILED DESCRIPTION

In the following description of the multiple protection group (MPG) erasure-resilient coding method, reference is made to the accompanying drawings, which form a part thereof, and in which is shown by way of illustration a specific example whereby the MPG erasure-resilient coding method may be practiced. It is to be understood that other embodiments may be utilized and structural changes may be made without departing from the scope of the claimed subject matter.

I. Operational Overview

Figure 1:
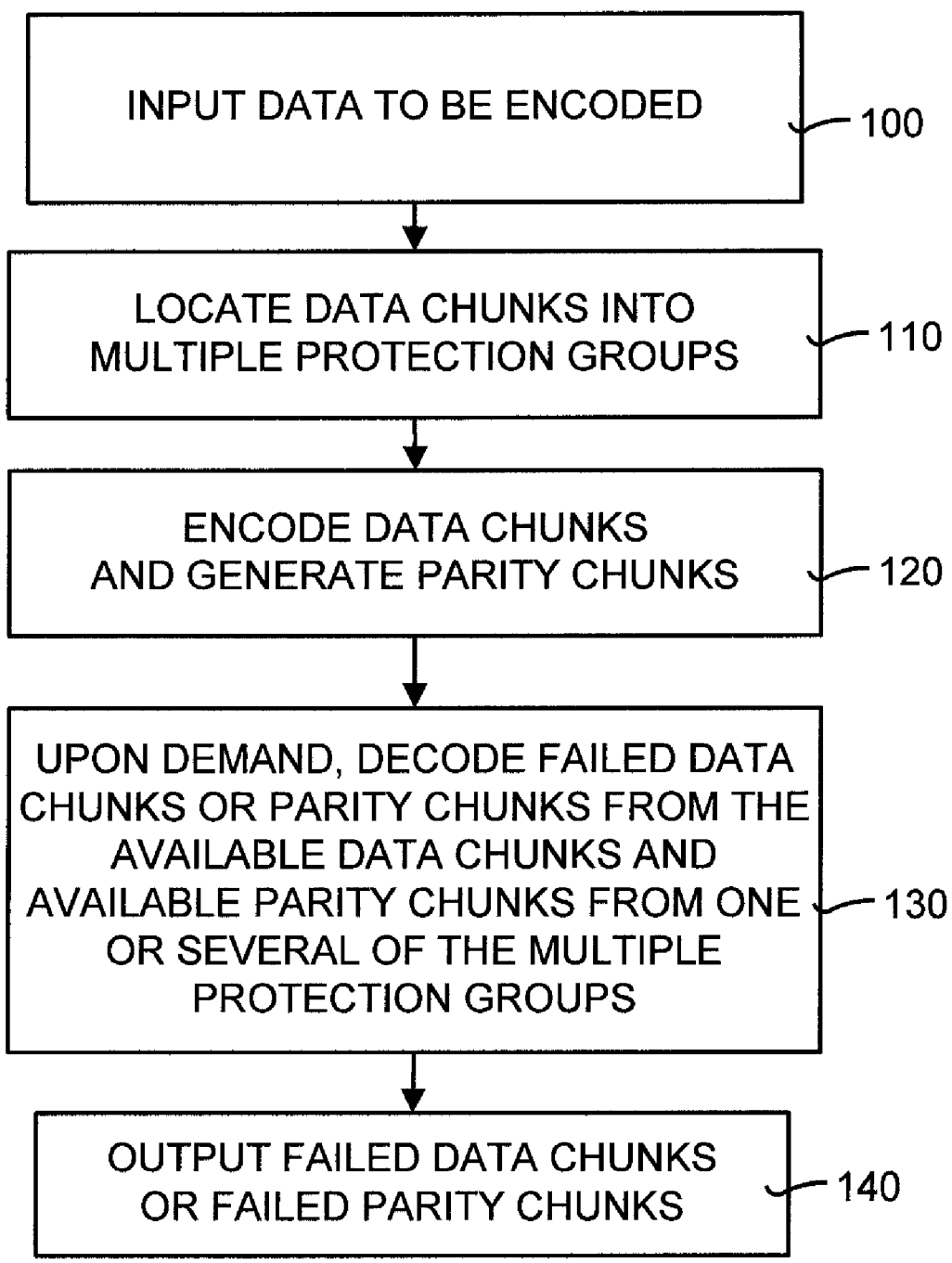
FIG. 1 is a general flow diagram illustrating the general operation of the multiple protection group (MPG) erasure-resilient coding method disclosed herein.

The operation of the multiple protection group (MPG) erasure-resilient coding method now will be discussed. FIG. 1 is a general flow diagram illustrating the general operation of the MPG erasure-resilient coding method disclosed herein. In general, the MPG erasure-resilient coding method is erasure resilient coding with multiple group protection. The data symbols are grouped into different protection groups. Moreover, for each protection group there is at least one parity.

In particular, as shown in FIG. 1, the method of coding and decoding data begins by inputting data chunks to be encoded (box 100). The data chunks are located into multiple protection groups (box 110). The data chunks then are encoded and generate parity chunks (box 120). Upon demand, failed data or parity chunks can be decoded from the available data chunks and available parity chunks from one or several multiple protection groups (box 130). The outputs are those failed data chunks or parity chunks (box 140).

II. Operational Details

Under the Multiple Protection Group Erasure-Resilient codes are a number of specific codes that can be constructed. These codes can broadly be divided into the basic Multiple Protection Group (MPG) codes and the generalized MPG codes. Each of these codes will now be discussed in detail.

Basic Multiple Protection Group (MPG) Codes

The first type of MPG codes to be constructed are basic MPG codes. The main concept of the basic MPG codes is that their construction is derived from (n,k) Maximum Distance Separable (MDS) codes, where, as stated previously, k are the number of original data chunks and n is the total number of chunks (including data and parity chunks). Since MDS codes are the starting point for MPG codes, a discussion of MDS codes is presented.

In the discussions presented below, the following terminology is used. Let a distributed storage system consists of n chunks, where k chunks are original data chunks, and the remaining m=n−k chunks are parity chunks (also called "parities"). The data chunks are denoted as $o_i$, i=1, . . . , k, and the parities are denoted as $p_j$, j=1, . . . , m.

Maximum Distance Separable (MDS) Erasure-Resilient Codes

Maximum Distance Separable (MDS) codes attract particular attention in distributed storage system design. MDS codes achieve the maximum erasure resilience. A (n,k) MDS code generates n−k parities from k original data chunks. All data are accessible as long as any k among n chunks are functional. In other words, the system is resilient to arbitrary n−k erasures and optimal.

Many commonly used ERC schemes in storage systems are specific examples of the MDS codes. For example, the simple parity scheme, which is widely used in the RAID-5 system, generates the only parity chunk as the binary XOR of all the data chunks. It is essentially a (k+1,k) MDS code. The replication scheme, which creates r replicas for each data chunk, is indeed a (1+r,1) MDS code. Reed-Solomon codes are generic MDS codes.

The MDS codes are efficient in terms of storage costs. However, their access overhead can be high. The access overhead consists of two parts: (1) the read overhead, and (2) the write overhead (sometimes also called update complexity). The read overhead and the write overhead are defined as the number of extra chunks required to "touch" (read/write) while reading or writing a particular data chunk, respectively. Any (n,k) MDS code must associate every data chunk with every parity chunk. The necessity of the full association is as follows. If the data chunk $o_i$ and the parity chunk $p_j$ were not associated, then the system could not recover the loss scenario, where the data chunk of and all parities except $p_j$ are gone. This contradicts with the MDS property. Therefore, whenever a single data chunk is updated, all n−k parities also need to be updated. This means that the write overhead or the update complexity is n−k. Meanwhile, if a single data chunk fails, k chunks need to be retrieved in order to recover the failure chunk. The necessity of retrieving full k chunks again is due to the full association of the MDS codes. Hence, the read overhead equals k. Since most distributed storage systems incur many more reads than writes, the read overhead is the primary design concern. And the significant access overhead of MDS codes might become a key limiting factor.

Basic Multiple Protection Group (MPG) Codes

Figure 2:
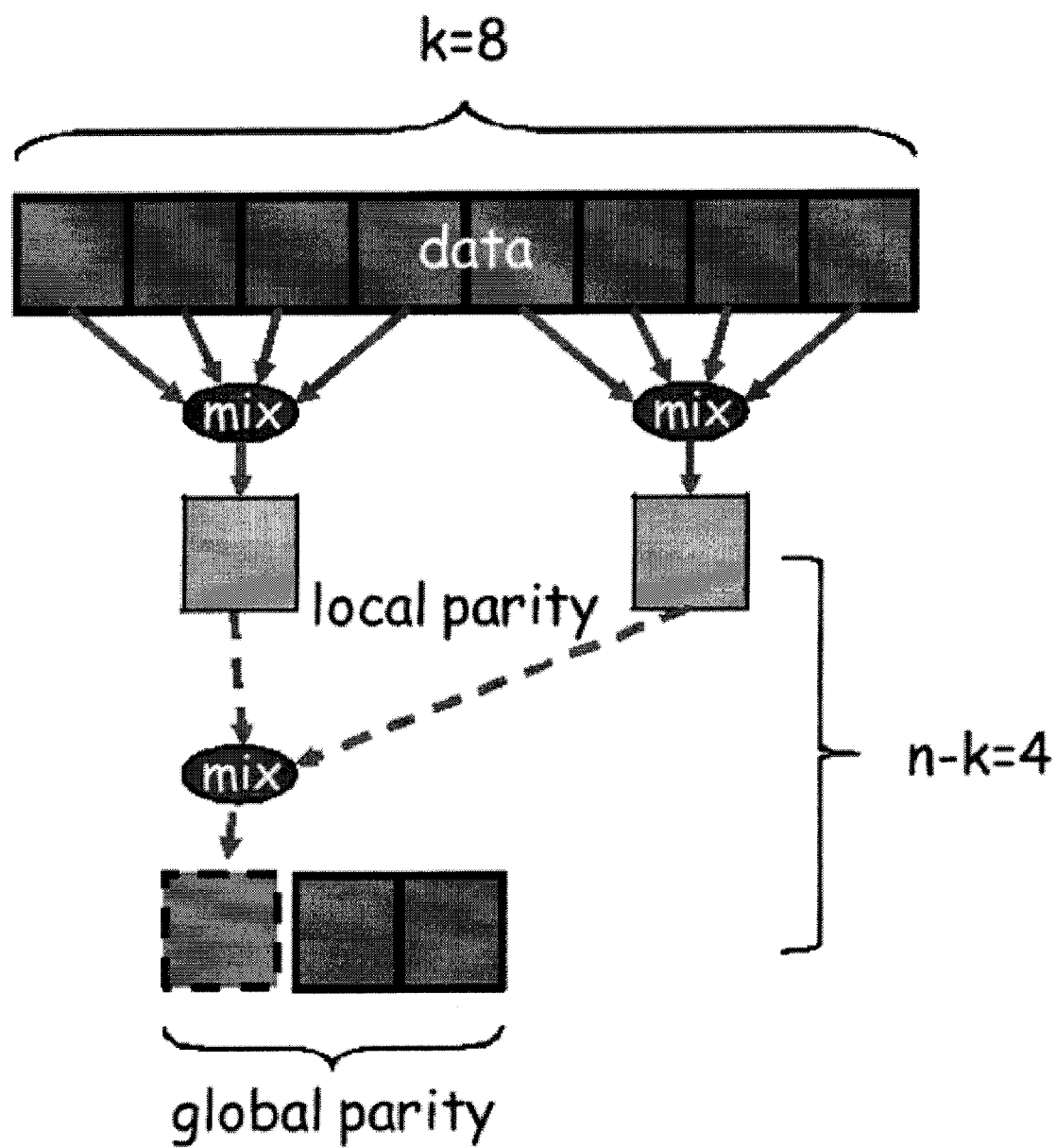
FIG. 2 is an illustration of an example of the basic MPG codes compared to the MDS codes.

In order to introduce the concept of the basic Multiple Protection Group (MPG) codes, an exemplary example is presented. FIG. 2 illustrates the basic MPG code compared to the MDS code for the above example. In general, the basic MPG code could reduce the read overhead by as much as 50% as compared to the MDS code, with one additional parity. More specifically, initially a (11,8) MDS code is constructed, which could be a Reed-Solomon code or any other MDS codes. Next, the original 8 data chunks are organized into two groups, whereby each group includes 4 data chunks. The (11,8) MDS code has three parities $p_1$, $p_2$, and $p_3$. Two of the parities ($p_1$ and $p_2$,) are kept so that they will serve as the global parities for all the 8 data chunks. Next, the other parity ($p_3$) is examined and split it into two parity chunks, one for each group. As the code is linear over certain Galois Field, the parity chunk $p_3$ can be computed as:

$$p_3 = \sum_{i=1,\ldots,8} \alpha_i \cdot o_i,$$

which is split into $p_{3,1}$ and $p_{3,2}$ and $$p_{3,1} = \sum_{i=1,\ldots,4} \alpha_i \cdot o_i,$$

$$p_{3,2} = \sum_{i=5,\ldots,8} \alpha_i \cdot o_i.$$

In other words, the parity chunk of each group (also known as local parity) in the basic MPG code is simply the MDS parity projected onto each group.

The constructed basic (12,8) MPG code can recover arbitrary 3 erasures, just as the original (11,8) MDS code. Assuming there are 3 erasures out of the 12 chunks, only one of two situations could occur: (1) both $p_{3,1}$ and $p_{3,2}$ are available; or (2) either one of them or both of them are unavailable. In the first situation, $p_3$ can be obtained by simply XORing $p_{3,1}$ and $p_{3,2}$. Then the problem becomes recovering 3 erasures from the original (11,8) MDS code, which is certainly feasible. In the second situation, beyond $p_{3,1}$ or $p_{3,2}$, at most 2 other chunks are unavailable. Hence, from the point of view of the original MDS code, there are still at most 3 erasures, which means that the code also is decodable.

Comparing the (11,8) MDS code and the (12,8) basic MPG code, they can both tolerate 3 erasures and have exactly the same update complexity. The basic MPG code uses one additional parity, but its read overhead is reduced from 8 to 4 when there is only one data chunk failure. This example shows the core concept of how the basic MPG codes can trade storage space for access efficiency. In fact, the basic MPG code reduces the read overhead almost by half as compared to the MDS code.

Figure 3:
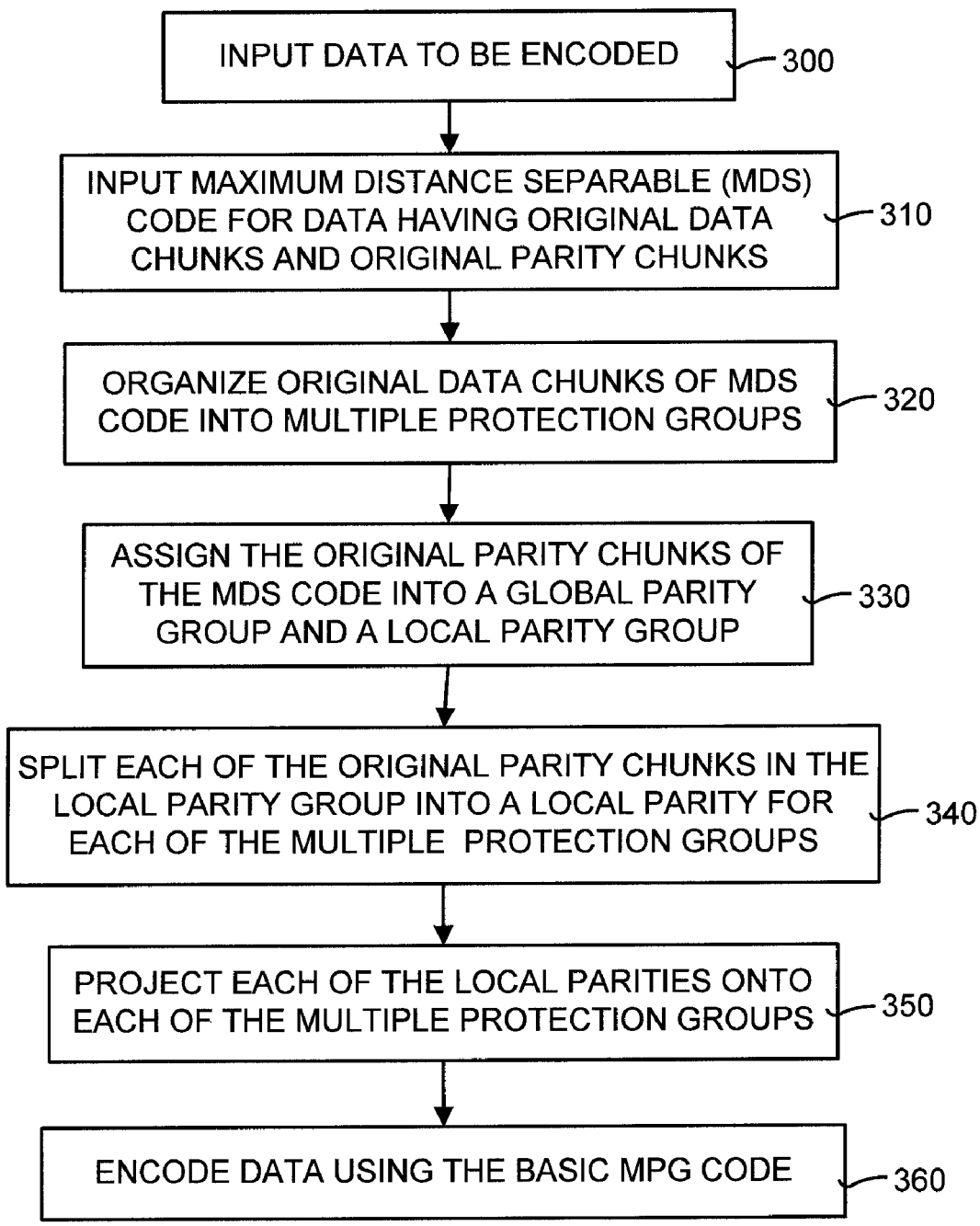
FIG. 3 is a detailed flow diagram illustrating the construction of basic MPG codes.

FIG. 3 is a detailed flow diagram illustrating the construction of basic MPG codes. The simplest basic MPG codes are two-hierarchy, where the construction method begins by organizing the original data chunks into more than one disjoint groups. Next, the parity chunks are organized into two parity groups. More specifically, the construction method produces basic MPG codes that can encode data having k original data chunks. As shown in FIG. 3, the construction method inputs data to be encoded (box 300). Next, the method starts from a (n,k) MDS code having n total chunks and (n−k) original parity chunks (box 310). The k original data chunks are organized into L number of protection groups, where L is greater than one (box 320). The (n−k) original parity chunks then are assigned or organized into a global parity group and a local parity group (box 330). Each of the original parity chunks in the local parity group is split into L number of local parities to generate the basic MPG code (box 340). The basic MPG codes split each parity of the local parity group into L local parities. The local parities chunks are the original parity chunk projected onto a protection group. Thus, an original parity is projected onto each protection group (box 350). Once constructed, the data is encoded using the basic MPG code (box 360).

In general, a basic MPG code of two hierarchies is constructed as follows. Starting from a (n,k) MDS code, the method organizes the original data chunks into L disjoint groups, $S_l$, l=1, . . . , L, where group $S_l$ has $k_l$ nodes: $|S_l|=k_l$. The method then organizes the m parity chunks into two groups, $m_0$ and $m_1$, with $m=m_0+m_1$. The basic MPG code is constructed by splitting each of the $m_1$ parities in to L local parities to each group, where group l forms a $(k_l+m_1,k_l)$ ERC code. The local parity chunk $p_{l,j}$ is simply the original parity chunk $p_j$ projected onto group $S_l$. Finally, the method assigns $m_0$ global parities that protect all the data chunks from all groups. These global parities are exactly the same as the parity chunks of the original (n,k) MDS code.

Figure 4:
FIG. 4 illustrates an exemplary example of a two-hierarchy basic MPG code construction.

Basic Multiple Protection Group (MPG) Codes Having a Multi-Hierarchical Extension The basic MPG codes can be also constructed from any number of hierarchies by extending the above construction method. The following examples are used to illustrate the construction of two-hierarchy and three-hierarchy basic MPG codes. An exemplary example of two-hierarchy basic MPG code construction is shown in FIG. 4. As shown in FIG. 4, the method constructs a code with three groups, each of which consists of 8 data chunks. The method then starts from a MDS code and assigns 2 local parities to each group. Beyond local groups, there are 2 global parities that protect all the 24 data chunks. The storage cost of the code is 4/3. The update complexity is 4, and the read overhead is 8 within the group, and 24 when the global parities are invoked. It should be noted that in this example the same number of data chunks are used for each group. Although this is not necessary for the basic MPG code construction, such practice usually leads to good data reliability.

The construction naturally extends to multi-hierarchy. To achieve this, the construction method organizes the data chunks within a certain group into multiple subgroups, and then divides the group parities into parities for the subgroups, and parities for the entire group. If necessary, the data chunks and parities of the subgroups can be further divide to create even more hierarchies. The constructed multi-hierarchy basic MPG code can still recover arbitrary m erasures and the update complexity is still m. Most of the failure recovery is performed at lowest level subgroups. Whenever it is not sufficient to recover within a subgroup, the method can go up one level and use the parity chunks of its constituent group. If it is still not recoverable, the method can go up further and use the parities of upper levels. This is very similar to climbing up a pyramid, such that the MPG codes can also be called "Pyramid codes".

Figure 5:
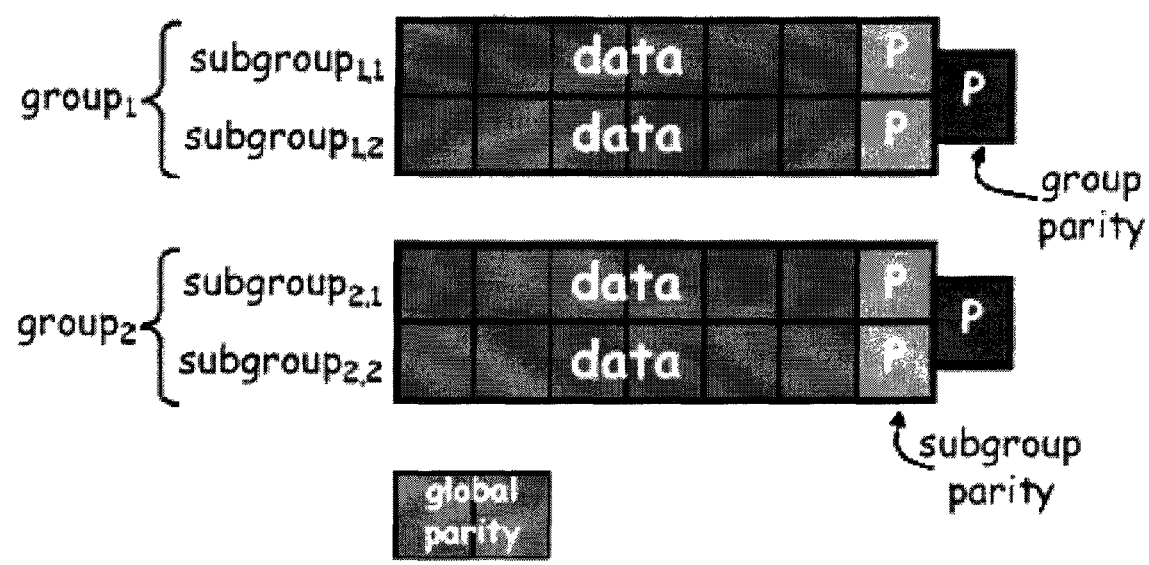
FIG. 5 illustrates an exemplary example of a three-hierarchy basic MPG code construction.
Figures 6, 7:
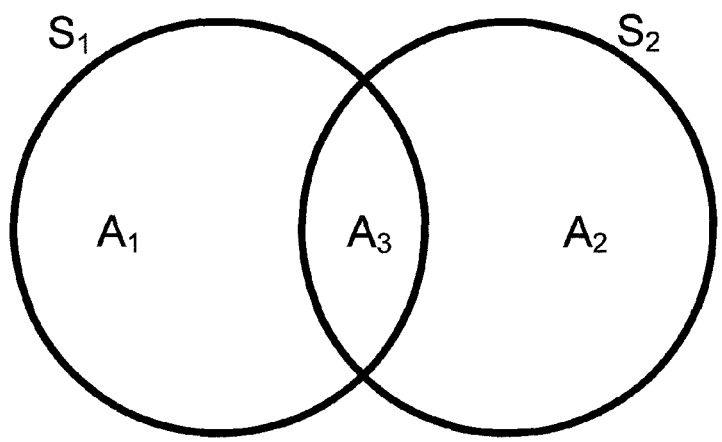
FIG. 6 is a table comparing the two-hierarchy MPG codes, the three-hierarchy MPG codes, and the MDS code.
FIG. 7 is an illustration of the concept of atom sets used in the discussion of the Maximally Recoverable (MR) property.

FIG. 5 illustrates an exemplary example of a three-hierarchy basic MPG code construction. FIG. 5 illustrates the situation where there are 2 global parities, 1 group parity for each group and 1 subgroup parity for each subgroup. It should be noted that the two-hierarchy MPG code in FIG. 4 and the three-hierarchy MPG code in FIG. 5 have the same storage cost and update complexity, but they differ at the read overhead and the data reliability, as shown in the table of FIG. 6. FIG. 6 also shows the read overhead and the data reliability of the (28,24) MDS code, which is the base code that used to construct these two MPG codes. In this example, the failure probability of individual chunk is set to 0.001. Compared with the two-hierarchy MPG code, the three-hierarchy MPG code further reduces the read overhead, but also results in a slightly lower data reliability. Nevertheless, both codes achieve much lower read overhead and slightly better data reliability compared to the MDS code, which again comes at a higher storage cost.

Maximally Recoverable Property

In the following sections the Maximally Recoverable (MR) property of MPG codes (such as the basic MPG code set forth above) is discussed. In general, an erasure-resilient code is an MPG code if its data symbols are separated into a number of protection groups, and each of the group is associated with one or more parity symbols generated to protect the data symbols within the group. The basic MPG code discussed above has shown that by utilizing multiple protection groups it is possible to reduce the decoding overhead (in terms of extra throughput needed to access data symbols in a distributed storage application) and at the same time satisfy the same data reliability and storage overhead requirement.

The way that the protection groups are formed over the MPG code is defined as a configuration. Generally, a configuration defines the structural relationship between the data symbols and the parity symbols. A more rigorous mathematical definition of the configuration is given below. Configuration plays a big role in the error/erasure recoverability of MPG codes. Because MPG code has shown to be effective in a distributed storage scenario, the discussion focuses on the best erasure recoverability aspect, though some of the result may be extended to error recoverability. MPG codes with MR property achieves the best recoverability under the configuration. In the following section are presented construction algorithms for MPG codes with MR property, under arbitrary configuration. Interestingly, both its recoverability and its decoding overhead (in other words, the number of extra symbols that are needed during the recovery) depend only on the configuration. In addition, sections below discuss how to perform decoding with minimum decoding overhead.

Problem Formulation

The formulation of the Maximally Recoverable (MR) property will now be set forth. Consider a (n,k) MPG erasure resilient code. Let $D=\{d_1, d_2, \ldots d_k\}$ be the set of data symbols to protect. The entire set D is partitioned into a number of subsets, represented by $S=\{S_1, S_2, \ldots S_L\}$ where, $S_l \subseteq D, l=1, \ldots L$. Each $S_l$ is defined as a protection group. The protection group may intersect, overlap, or contain one another to provide different degree of protection to the data symbols.

Let $U_l = \{t_1^l, \ldots, t_{u_l}^l\}$ be the protection group of parity symbols generated using only the data symbols in $S_l$. Let $u_l = |U_l|$ be the size of set $U_l$, satisfying $\Sigma_{l=1}^L u_l = n-k$. In addition, let $\Omega=\{(S_1,U_1), (S_2,U_2), \ldots, (S_L,U_L)\}$ be a configuration representing the structural relationship between the data symbols and the parity symbols. Let $V_l = S_l \cup U_l, l=1, \ldots L$. Atom sets for $\Omega$ are defined are follows:

$$\begin{array}{ll} S_i \backslash \cup_{j \ne i} S_j, & 1 \le i \le L \\ (S_{i_1} \cap S_{i_2}) \backslash \cup_{j \ne i_1, i_2} S_j, & 1 \le i_1, i_2 \le L, i_1 \ne i_2 \\ \ldots & \\ \cap_{1 \le m \le M} S_{i_m} \backslash \cup_{j \ne i_m, 1 \le m \le M} S_j, & 1 \le i_1, \ldots, i_M \le L, \\ & i_{m1} \ne i_{m2}, \\ & 1 \le m_1 \ne m_2 \le M, \\ & M \le L \end{array}$$

There are altogether $2^L-1$ atom sets, which are denoted, which are denoted as $A_1, \ldots, A_H$. Unlike the protection group, the atom sets are disjoint from each other.

FIG. 7 is an illustration of the concept of atom sets. In the illustration of FIG. 7, 11 data symbols are separated into two protection groups $S_1$ and $S_2$, where $S_1$ contains 8 data symbols and $S_2$ contains 9 data symbols. The data symbols in $S_1$ are protected by 3 parity symbols in $U_1$, and the data symbols in $S_2$ are protected by 4 parity symbols in $U_2$. Moreover, there are 3 atom sets, namely $A_1$, $A_2$, and $A_3$. Atom set $A_1$ contains 2 data symbols, $A_2$ contains 3 data symbols, and $A_3$ contains 6 data symbols.

From the point of view of an atom set, the 6 data symbols in $A_3$ are protected by all 7 parity symbols in the union of $U_1$ and $U_2$ ($U_1 \cup U_2$). The 2 data symbols in $A_1$ are only protected by the 3 parity symbols in $U_1$ and the 3 data symbols in $A_2$ are only protected by the 4 parity symbols in $U_2$.

There are two techniques that can be used to detect whether a code is recoverable or unrecoverable. Specifically, these techniques detect whether an erasure pattern is recoverable or unrecoverable. The first embodiment of the detection technique uses the atomic assignments (discussed below) and matrices to perform the detection. The second embodiment of the detection technique uses a Tanner graph. Each embodiment of the detection technique will now be discussed.

Detecting Whether a Code is Recoverable Using Atomic Assignments

The set of all possible parity symbols that can be used to recover the erasures in $A_h$ is denoted as $\Lambda(A_h)=\{U_j U_j | A_h \subseteq S_j, 1 \le j \le L\}$. Let G be a n×k generator matrix for any systematic erasure resilient code over $\Omega$. Each data and parity symbol maps to one row in G, classified as data row and parity row, respectively. For the parity row corresponding to the parity symbol $t_i^l$, the row vector can only take nonzero value in entries corresponding to the data symbols in $S_l$.

Given an erasure pattern e, the rows in G corresponding to the lost data and parity symbols are crossed out. All k data symbols can be recovered if and only if the remaining sub-matrix, denoted by G'(e), has rank k. The remaining parity rows can be assigned to the position of lost data rows to reconstruct a rank k matrix. It should be noted that one parity row can only be assigned to one lost data row.

FIG. 8 illustrates an example of this type of assignment. For G'(e) to have rank k, it is necessary that there exists an assignment such that all the diagonal entries of G'(e) are nonzero. This is defined as a size k matching in G'(e). In other words, that G'(e) has rank k implies a size k matching. This necessary condition is equivalent to the condition discussed below based on full size matching in a Tanner graph, which is the second embodiment of the detection technique.

In FIG. 8 it should be noted that the 3 parity rows assigned to the 3 lost data rows corresponding to data symbols in $A_h$, must belong to $\Lambda(A_h)$, a necessary condition for e to be recoverable is that there exists an atomic assignment of remaining parity rows in $\Lambda(A_h)$ to $A_h$, such that the number of lost data symbols in $A_h$ is equal to the number of assigned parity symbols. The set containing all such e is defined as a Maximally Recoverable Set (MRS) for $\Omega$, denoted by $E(\Omega)$.

Assume for e, there are $I_1, \ldots, I_I$ lost data symbols in $A_1, \ldots, A_I$, respectively, and remaining $p_1, \ldots, p_J$ parity symbols in $U_1, \ldots, U_J$, respectively, protecting data symbols in $A_1, \ldots, A_I$. The atomic assignment are represented by a matrix whereby the columns correspond to $A_1, \ldots, A_I$, the rows correspond to $U_1, \ldots, U_J$, with zero entry in the (i,j) position where $U_i$ does not protect data symbols in $A_j$. The goal is to assign nonnegative integers for each nonzero (i,j) entries, such that the sum of column i is equal to $I_i$, and the sum of row j is no more than $p_j$. The table of FIG. 9 illustrates an atomic assignment example for the configuration shown in FIG. 7 with $l_1=l_2=2$, $l_3=3$, $p_1=3$, and $p_2=4$.

Detecting Whether a Code is Recoverable Using Tanner Graphs

The second embodiment of the detection technique uses a Tanner graph. In this second embodiment, detecting whether a code is recoverable translates into finding a maximum size matching in Tanner graph. In general, this embodiment uses the fact that an erasure pattern is recoverable only if its corresponding Tanner graph contains a full size matching. Moreover, any recoverable erasure pattern can be recovered by the generalized MPG codes, which are discussed in detail below.

The Tanner graph is a bipartite graph and is a tool that is frequently used in linear block ERC study. The left part of a Tanner graph consists of data chunks, whereas the right part of the graph consists of parity chunks. An edge in the Tanner graph links the associated data and parity chunks. A Tanner graph of the ERC code defines a configuration of the code, which shows how the data chunks and parity chunks are connected. For each erasure pattern, a corresponding Tanner graph is constructed by removing all data chunks that are available and all parity chunks that are lost. In addition, all edges are removed that are associated with the removed data and parity chunks.

Figure 10:
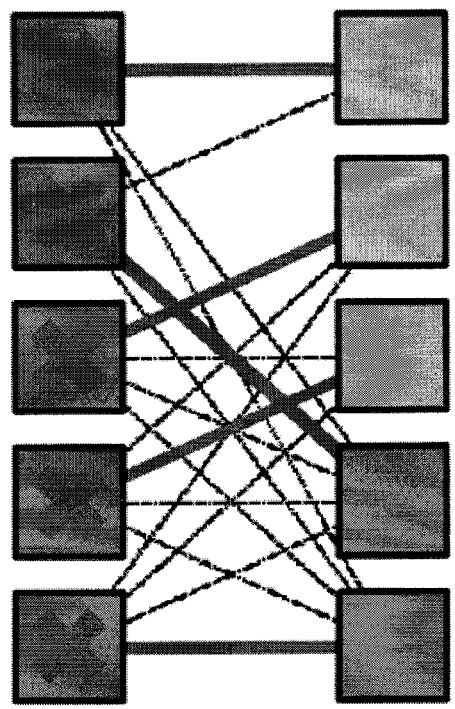
FIG. 10 illustrates a second embodiment of the MR detection technique using a Tanner graph having maximum matchings.

FIG. 10 is an example of a Tanner graph illustrating maximum matchings. For the erasure pattern shown in FIG. 11, the corresponding Tanner graph can be shown in FIG. 10. A matching, M, in the Tanner graph is defined as a set of edges, no two of which meet at the same vertex. The size of the matching is defined as the number of edges. A cover $V_c$ in the Tanner graph is defined as a vertex set that contains at least one endpoint of every edge in the graph. A maximum matching is a matching with the greatest number of edges. The corresponding Tanner graph of an erasure pattern is defined as having a full size matching if a matching can be found with size equal to the number of lost data chunks (in other words, the number of data nodes in the Tanner graph). In FIG. 10 it is shown that a full size matching can be found for the recoverable erasure pattern. Moreover, FIG. 12 illustrate an example of a Tanner graph whereby a full size matching cannot be found for the unrecoverable erasure pattern shown in FIG. 13.

Generalized Multiple Protection Group (MPG) Codes

This section presents an alternate construction method for the Multiple Protection Group (MPG) codes. Compared with the basic MPG codes, this construction method generally leads to better data reliability with the same storage cost. The MPG codes that are constructed in this section are called the generalized MPG codes. In terms of data reliability, the storage cost and the access overhead trade-offs, the generalized MPG codes are usually superior to the basic MPG codes. The generalized MPG codes discussed below can decode any recoverable erasure pattern. In other words, the generalized MPG codes are the only known codes having the Maximally Recoverable property. However, the generalized MPG codes need a non-trivial code construction process, may need to operate on a larger order Galois Field, and may have higher computational complexity in encoding and decoding.

Construction of the Generalized MPG Codes

The generalized MPG codes have the same data and parity association as the basic MPG codes. However, unlike the basic MPG codes, the generalized MPG codes are constructed by filling its generator matrix G through a deterministic construction algorithm. Since MPG codes are systematic ERC codes, G starts with a k×k identity matrix at top. Let $g_m$ be the $(k+m)^{th}$ row of G, and let $G_m$ be the truncated generator matrix of the top k+i rows. When constructing a (n,k) generalized MPG codes, the key is to construct a n×k generator matrix G, which has a full rank k corresponding to every recoverable erasure pattern.

The following construction of the generalized MPG codes guarantees that the codes have the MR property. As discussed above, if an erasure pattern is unrecoverable, then there is no way that any erasure code can be constructed that can recover data loss in such erasure patterns. Moreover, if there is a recoverable erasure pattern, then a code can be constructed that can recover all recoverable erasure patterns. The purpose of the construction of the generalized MPG codes is to construct a code that can correct any recoverable erasure patterns.

In particular, a generalized MPG code is constructed by creating row vectors of its generator matrix G, one row at a time. In particular, a null space matrix is constructed to hold all null space vectors of sub-matrices of the generator matrix (box 1400). A new row vector of the generator matrix is found such that its dot product with any row vector in the null space matrix is not equal to zero (box 1410). This row vector is then added to the generator matrix G (box 1420). A determination is made as to whether more row vectors should be added to the generator matrix (box 1430). If so, then the null space matrix is expanded (box 1440) and another new row vector can be found (box 1410). This process is repeated for all row vectors of the generator matrix G. When all row vector have been found, then the constructed generator matrix is used to encode data using the generalized MPG codes (box 1450).

Mathematically, the method for constructing the generalized MPG codes is as follows. The parity chunk is constructed inductively using the following four steps. The first step is to identify the non-zero position of the row vector. For the row vector $g_m$ that corresponds to the $m^{th}$ parity chunk, if it is a global parity, it should be non-zero at all entries. On the other hand, if it is a local parity of group, it should be non-zero at all entries that correspond to the data chunks in the group, and be zero for all other entries. The reason for this property is similar to the full association requirement of the MDS code.

The second step is to construct a matrix U that holds all null space vectors. There are two embodiments for this second step. The first embodiment makes use of the fact that each added $g_m$ should be capable of recovering all recoverable erasure patterns of $G_m$. Therefore, $g_m$ must satisfy that any submatrix S in $G_m$ that has rank k−1 can be combined with $g_m$ to form a generator submatrix that has full rank k. All matrices with rank smaller than k−1 correspond to a non-recoverable erasure pattern, and does not need to be considered by the construction. Thus, $g_m$ should not be contained in the space spanned by S: span(S), for all S with rank(S)=k−1.

Because S is of rank k−1, it is enough to find a vector u that is perpendicular to span(S). Mathematically, u spans the null space of S. The condition that $g_m$ is not an element of span(S) is equivalent to saying that $u \cdot g_m \neq 0$. Assume that U is a matrix that holds all null space vectors of all subspaces S having rank k−1. When no parity chunk is added, $G_0 = I_{k \times k}$. It also can be shown that U is an identity matrix. With each added parity row vector $g_m$, the matrix U is updated with new null space vectors.

The second embodiment of the second step uses that fact that a systematic erasure resilient code is said to have Maximally Recoverable (MR) property under the configuration $\Omega$, if it can recover any $e \in E(\Omega)$. For all $e \in E(\Omega_{i+1})$, $G'_i(e \backslash \{t^l_m\})$ must have rank k−1 or k. Otherwise, $G'_{i+1}(e)$ cannot have rank k and e is not recoverable under configuration $\Omega$, which contradicts with the assumption. If $G'_i(e \backslash \{t^l_m\})$ has rank k, the value of $t^l_m$ does not matter. Considering all $e \in E(\Omega_{i+1})$ that $G'_i(e \backslash \{t^l_m\})$ has rank k−1. These are the erasure patterns that $t^l_m$ helps in the recovery process. The goal is to assign value for $g_{i+1}$ so that $G'_{i+1}(e)$ has rank k for all $e \in E(\Omega_{i+1})$. $G'_{i+1}(e)$ is given by:

$$G'_{i+1}(e) = \begin{pmatrix} G'_i(e \backslash \{t^l_m\}) \\ g_{i+1} \end{pmatrix}.$$

Let the null space of $G'_i(e \backslash \{t^l_m\})$ be $N(G'_i(e \backslash \{t^l_m\}))$. Because $G'_i(e \backslash \{t^l_m\})$ is of rank k−1, the null space is a nonzero row vector that is perpendicular to all row vectors in $G'_i(e \backslash \{t^l_m\})$. For $G'_{i+1}(e)$ to have rank k, it is sufficient to select $g_{i+1}$ that is not orthogonal to $N(G'_i(e \backslash \{t^l_m\}))$. In other words, $(g_{i+1}, N(G'_i(e \backslash \{t^l_m\}))) \neq 0$. The idea is to select a $g_{i+1}$ that is not perpendicular to any $N(G'_i(e \backslash \{t^l_m\}))$.

For each $e \in E(\Omega_{i+1})$ that does not contain $t^l_m$, and where $G'_i(e \backslash \{t^l_m\})$ has rank k−1, all $N(G'_i(e \backslash \{t^l_m\}))$ are computed to form a matrix out of the results by using each $N(G'_i(e \backslash \{t^l_m\}))$ as a row vector. This matrix has a finite number of rows, and this number is bounded by $$\binom{i}{k-1}.$$

Computing each $N(G'_i(e \backslash \{t^l_m\}))$ can be done with $O(k^3)$ complexity.

The third step includes finding a row vector $g_m$ such that for all $u \in U$, $u \cdot g_m \neq 0$. There are two embodiments for this third step. In the first embodiment of the third step, it is assumed that $u_i$ is the $i^{th}$ row vector in U. This step begins with a random vector $g_m$, and with zero columns set according to the first step. Next, the dot product of $g_m$ and u is checked. If $g_m \cdot u = 0$, then $g_m$ is kept and the process moves to $u_1$, and so forth. The process repeats until the first row vector $u_j \in U$ is encountered, so that $g_m \cdot u_j = 0$. Note that if $u_j$ has zero values for all non-zero columns of $g_m$, it corresponds to a subgroup or group different from the parity group of $g_m$, and simply may be skipped for checking.

The need then arises to modify $g_m$ such that the dot product $g_m \cdot u_j$ is no longer zero, while still keeps all previous $g_m \cdot u_i = 0$, $i < j$. This can be accomplished by simply setting $g'_m = g_m + \epsilon u_j$ ($\epsilon \neq 0$). Any non-zero E satisfies the equation, $$g'_m \cdot u_j = (g_m + \epsilon u_j) \cdot u_j \cdot u_j \neq 0.$$

The goal is to choose a particular $\epsilon$ value so that, $$\forall u_i (0 \leq i \leq j), g'_m \cdot u_i \neq 0.$$

A set is constructed called $\epsilon_{bad}$, which contains all $\epsilon$ that do not satisfy the inequality above. For $u_i$, the $\epsilon$ to avoid is, $$\epsilon = (g_m u_i)/(u_i \cdot u_j).$$

Figure 14:
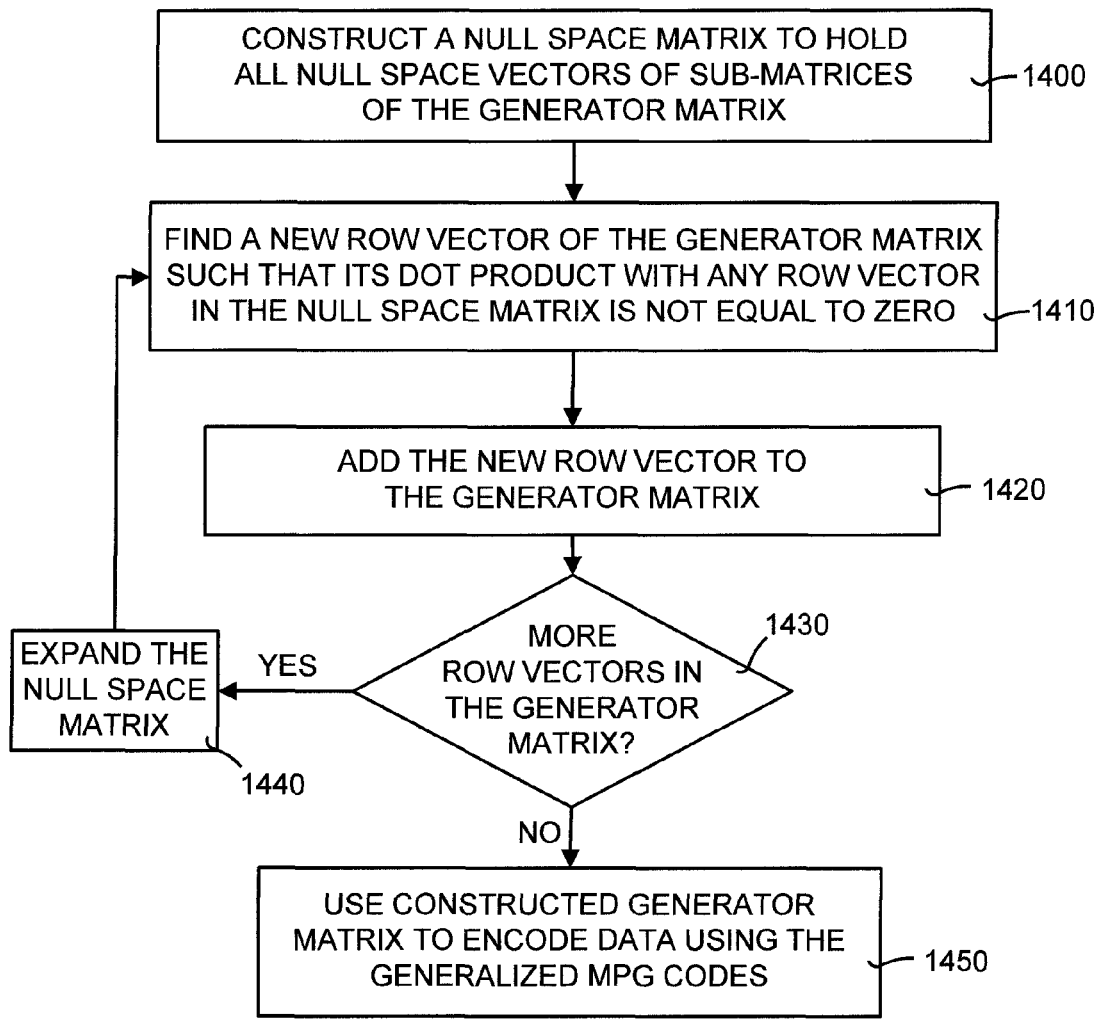
FIG. 14 is a flow diagram of the construction of the generalized MPG codes.

After $\epsilon_{bad}$ for all $i < j$ is constructed, a random non-zero $\epsilon$ is selected in $\epsilon_{bad}$. If the size of the Galois Field is larger than the total number of rows in U, which is very loosely bounded by $$\binom{n-1}{k-1},$$

such a non-zero $\epsilon$ can be found. Processing through all $u \in U$, a new row vector $g_m$ is obtained for the $m^{th}$ parity chunk. FIG. 15 is pseudocode of an exemplary embodiment of the construction method of the generalized MPG codes shown in FIG. 14.

The second embodiment of the third step includes letting $f_1, \ldots, f_{ul}$ be $u_l$ row vectors that correspond to data symbols in $U_l$. Also let $f_j$, $j = u_l + 1, \ldots, J$ be the projection of j-th row vector onto the sub space span $(f_1, \ldots, f_{ul})$. In other words, set all coefficients other than those of the data symbols in $U_l$ to be all zero. It is apparent that $g_{i+1} \in \text{span}(f_1, \ldots, f_{ul})$, and $g_{i+1}$ need to be constructed so that they satisfy $\langle g_{i+1}, f_j \rangle \neq 0g$ for $j = 1, \ldots, J$.

Let $\epsilon = [\epsilon_1, \ldots, \epsilon_{ul}]^T$ and $$g_{i+1} = \epsilon_1 f_1 + \ldots + \epsilon_{u_l} f_{u_l},$$

then $$\langle g_{i+1}, f_j \rangle = \sum_{m=1}^{u_i} \epsilon_m \langle f_m, f_j \rangle = \sum_{m=1}^{u_i} \epsilon_m f_{j,m},$$

where $f_{j,m}$ is simply the m-th column coefficient of $f_j$.

Next, the dot products are written in a J×$u_l$ matrix form, to obtain $$\begin{pmatrix} f_{1,1} & \cdots & f_{1,u_i} \\ \vdots & \ddots & \vdots \\ f_{J,1} & \cdots & f_{J,u_i} \end{pmatrix} \varepsilon = \begin{pmatrix} I_{u_i} \\ f_{u_i+1} \\ \cdots \\ f_J \end{pmatrix} \varepsilon \triangleq \begin{pmatrix} I_{u_i} \\ F \end{pmatrix} \varepsilon.$$

The term $\epsilon$ should be chosen to be nonzero and satisfying $F\epsilon$ is nonzero in every row. Suppose that the code is generated in GF(q), then each row constraint defines a plane to avoid in the space GF($q^{ul}$), with the plane having $q^{ul-1}$ elements in GF($q_{ul}$). Since $\epsilon$ has $(q-1)^{ul}$ nonzero choices, if $q>J-u_l+1$ then $\epsilon$ can have at least one satisfying choice. As J is bounded by $$\binom{n-1}{k-1}$$

and $u_i \geq 1$, a sufficient condition then is $$q \geq \binom{u-1}{k-1}.$$

If such $\epsilon$ exist, the following procedure can be applied to search for such $\epsilon$., a nonzero $\epsilon$ is randomly selected. Next, the equation above for the dot products written in a J×$u_l$ matrix form is computed. The process is finished if there is no zero entry in all the rows. Otherwise, $\epsilon_1, \ldots, \epsilon_{ul}$ are tuned one by one. First, $\epsilon_1$ is tuned for all null vectors $f_j$ with $f_{j,1}$ not equal to zero. A value is calculated to avoid for $\epsilon_1$ as $$\left(\sum_{m=2}^{u_i} \varepsilon_m f_{j,m}\right) / f_{j,1}.$$

Then arbitrary values of $\epsilon_1$ are selected that are not in the set of avoid values. It is guaranteed to find at least one surviving value in GF(q) if $$q > \binom{n-1}{k-1} + 1.$$

After $\epsilon_1$ is adjusted then only those vectors $f_j$ with $f_{j,1}=0$ are not considered and there could still be zero entries in the above equation having the dot products written in a J×$u_l$ matrix form. If so, then the process moves on to $\epsilon_2$.

For each $f_j$ with $f_{j,2} \neq 0$, a value again is computed to avoid for $\epsilon_2$ as $$\left(\sum_{m=1,3,\ldots,u_i} \varepsilon_m f_{j,m}\right) / f_{j,2},$$

and choose from the remaining values for $\epsilon_2$. After tuning $\epsilon_2$, only those vectors $f_j$ with $f_{j,1}=f_{j,2}=0$ can result in zero entries for the equation. Thus, the tuning process reduces the number of rows with value zero in the above equation having the dot products written in a J×$u_l$ matrix form. The step is repeated until it comes to $\epsilon_{ul}$, or all rows in the equation are is nonzero. The resulting $\epsilon$ is the desired one. The worst case complexity to compute $\epsilon$ is O($Jk^2$). After this induction process, a MR generator matrix G is constructed for $\Omega$. The computation complexity is $$O\left((n-k)k^3 \binom{n-1}{k-1}\right)$$

for generating all n−k parity symbols. The fourth and final step is to repeat the second and third steps until all the generator vectors for the parity chunks are generated.

Comparison Between the Basic MPG Codes and the Generalized MPG Codes

In this section, the generalized MPG codes are compared to the basic MPG codes. First, it should be noticed that the generalized MPG codes have better failure recovery capability because they can recover all recoverable erasure patterns. Second, the generalized MPG codes can be constructed much more flexibly than the basic MPG codes. The basic MPG codes require all configurations to be nested. In other word, the data chunks of a subgroup always form a subset of a higher hierarchy group, and the data chunks of two groups do not intersect with each other. The generalized MPG codes, however, do not impose such a constraint, and the data chunks of two groups can overlap. Third, the generalized MPG codes may have higher computational complexity in encoding and decoding, and may need a larger Galois Field. As the basic MPG codes are constructed by modifying an existing MDS codes, they can be easily created from well-known codes, such as Reed-Solomon codes, which often use small finite fields.

Comparison Between the Generalized MPG Codes and Other ERC Codes

Figure 16:
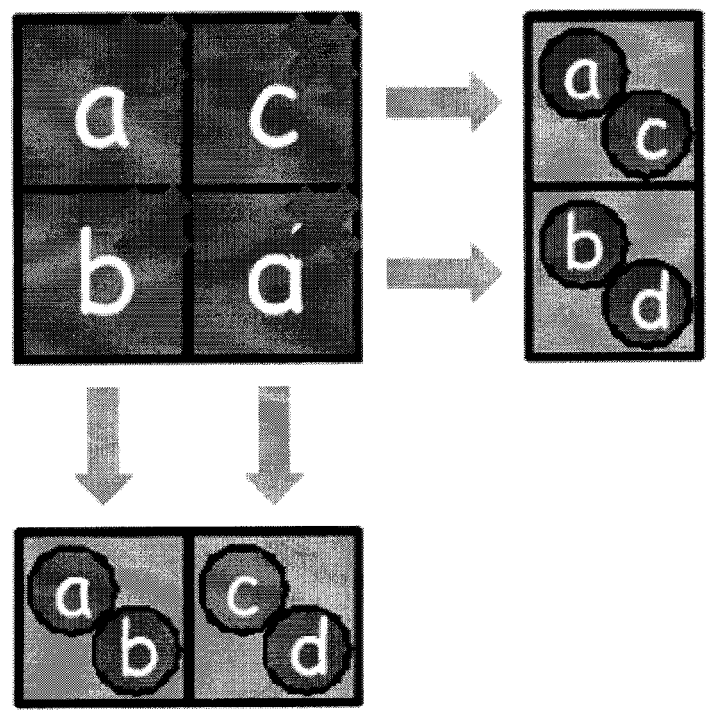
FIG. 16 is a first example comparing the generalized MPG codes to a simple form of a product code.

The generalized MPG codes can also be compared to other ERC codes of the same configuration. In a first example shown in FIG. 16, the generalized MPG codes are compared to a simple form of a product code. As shown in FIG. 16, the product code uses 2 row parities and 2 column parities. It can be considered as two simple parity codes that are applied to rows and columns, independently. Product codes often use iterative decoding to recover the erasures. For the particular erasure pattern shown in FIG. 16, iterative decoding cannot succeed. For the generalized MPG codes, however, such erasure pattern is decodable.

One generator matrix constructed by the generalized MPG codes method above is as follows (in GF($2^8$), using $x^8+x^4+x^3+x^2+1$ as the prime polynomial):

$$G = \begin{bmatrix} 1 & 0 & 0 & 0 \\ 0 & 1 & 0 & 0 \\ 0 & 0 & 1 & 0 \\ 0 & 0 & 0 & 1 \\ 1 & 142 & 0 & 0 \\ 0 & 0 & 244 & 71 \\ 41 & 0 & 190 & 0 \\ 0 & 108 & 0 & 174 \end{bmatrix}.$$

It is straightforward to verify that the generator submatrix formed by the last 4 rows of G is indeed invertible. In other words, it can be shown that the erasure pattern in FIG. 16 is recoverable. The generalized MPG codes use finite field operations, while the product code uses simple XOR operations. Nevertheless, the generalized MPG code shows better data reliability with the same code configuration.

Figure 17:
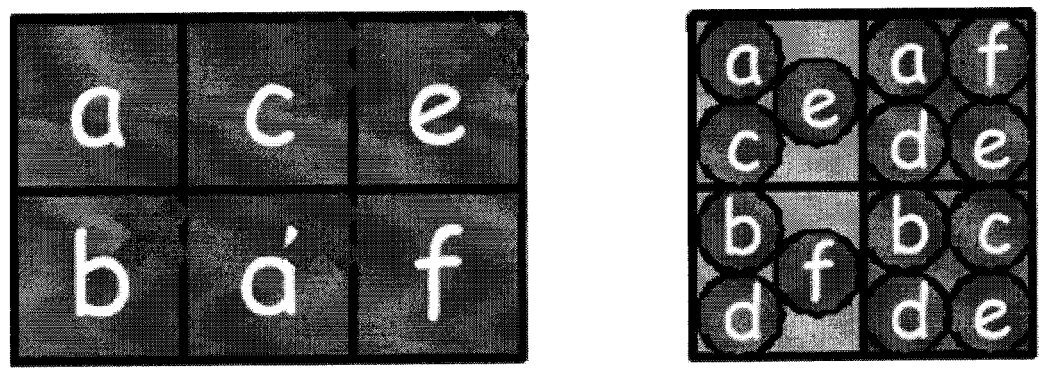
FIG. 17 is a second example comparing an EVENODD ERC code to the generalized MPG codes.

In FIG. 17, an EVENODD ERC code is compared to the generalized MPG codes. The particular erasure pattern shown in FIG. 17 is not recoverable by the EVENODD code, but is recoverable by the generalized MPG code. Of course, the EVENODD code is designed to protect whole disk (or column) failure, so that the erasure pattern shown is not considered in the EVENODD code design. However, if there are sector failures in disks, then the generalized MPG codes certainly achieve better data reliability than existing two dimensional ERC schemes.

Decoding of the Basic MPG Codes

The decoding method for the basic MPG code is related to the construction method. Specifically, in the construction of the basic MPG codes a projection is performed. Similarly, in the decoding of the basic MPG codes multiple parities are combined back into a single parity.

Figure 18:
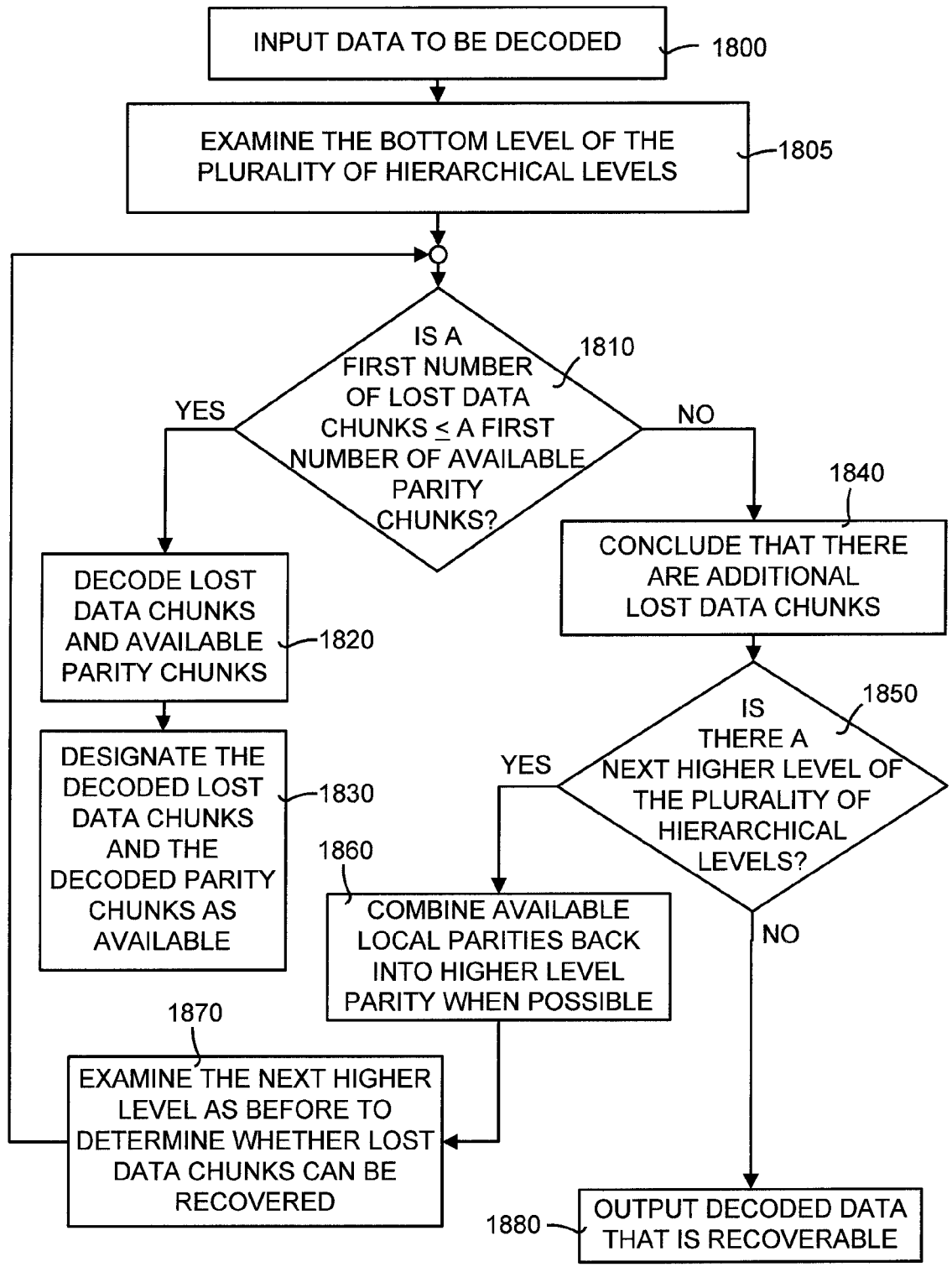
FIG. 18 is a detailed flow diagram illustrating the decoding process for the basic MPG codes constructed using the method shown in FIG. 3.

FIG. 18 is a detailed flow diagram illustrating the decoding process for the basic MPG codes constructed using the method shown in FIG. 3. As shown in FIG. 18, the decoding process begins by inputting data to be decoded (box 1800). Next, a determination is made at a bottom level of the plurality of hierarchical levels whether a first number of lost data chunks is smaller than or equal to a first number of available parity chunks (box 1810). If the first number of lost data chunks is smaller than or equal to the first number of available parity chunks, then each of the lost data chunks and lost parity chunks are decoded (box 1820). Each of the decoded lost data chunks and each of the decoded parity chunks are designated as available (box 1830). Otherwise, if the first number of lost data chunks is greater than the first number of available parity chunks, then a conclusion is reached that there are additional lost data chunks (box 1840). A determination then is made as to whether there is a next higher level in the plurality of hierarchical levels (box 1850). If so, available local parities are combined to back into higher level parity whenever possible (box 1860). Then the next higher level is examined as before to determine whether the lost data chunks can be recovered (box 1870). When each of the levels has been examined or each of the lost data chunks has been recovered, then the decoded data that is recoverable is output (box 1880).

Figure 11:
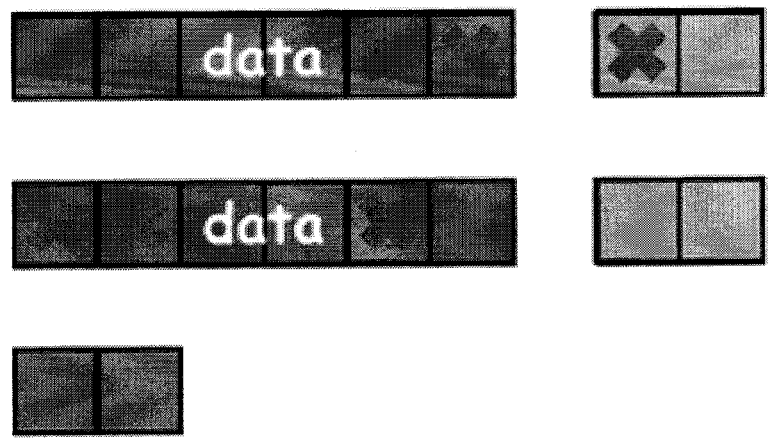
FIG. 11 illustrates a recoverable erasure pattern as used by the MR detection technique shown in FIG. 10.
Figure 12:
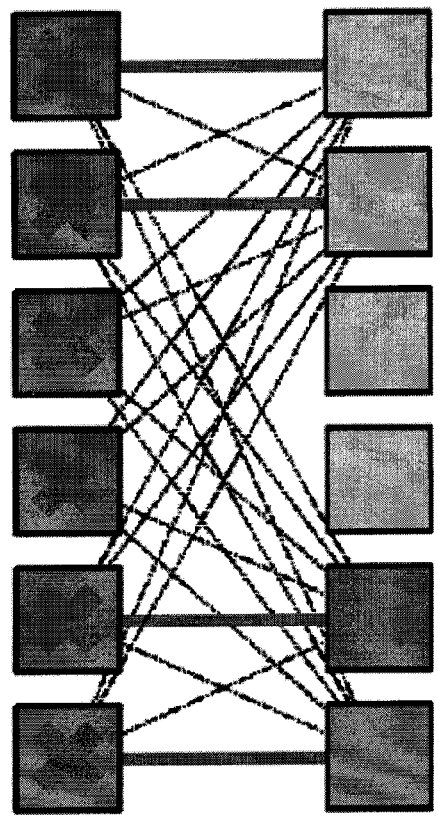
FIG. 12 illustrates a second embodiment of the MR detection technique using a Tanner graph where maximum matchings cannot be found.
Figure 13:
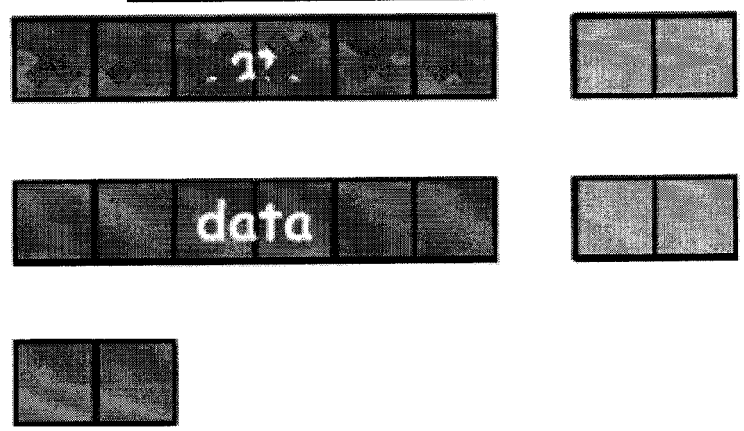
FIG. 13 illustrates an unrecoverable erasure pattern as used by the MR detection technique shown in FIG. 12.

By way of example, consider a basic MPG code as shown in FIGS. 11 and 13. The code is constructed from a (16 12) MDS code. It has two groups, each of which has 6 data chunks. Each group is protected by a (8,6) MDS code, and there are two additional global parities that protect the entire 12 data chunks. If the code is a basic MPG code it can recover from arbitrary 4 erasures. Moreover, since it has 6 parity chunks it obviously cannot recover more than 6 erasures. The basic MPG Code cannot recover the erasure pattern shown in FIG. 13. The reason is that there are 6 surviving data chunks and 2 parity chunks in group 2. This causes the 2 parity chunks in group 2 to be redundant. After these 2 redundant parities are removed 6 blocks have been lost and only 4 parities are associated with the lost blocks. The lost blocks cannot be recovered.

The basic MPG code also cannot recover the erasure pattern shown in FIG. 11. After the group parity chunks are XORed and use the global parities, there are 5 lost data chunks in total and only 3 surviving parities. Thus, the base (16,12) MDS code cannot be used to decode the lost data chunks. However, this does not mean that the lost data chunks cannot be recovered through other means (such as a direct Gaussian elimination decoding). Following is how to determine whether a given erasure pattern is recoverable or unrecoverable in a basic MPG code. The decision process is as follows.

The process begins by examining the bottom hierarchical level of the MPG code. Assume that this is a three-hierarchy MPG code. Each subgroup then is examined. If the number of the lost data chunks is smaller than or equal to the number of available parity chunks, then all lost data chunks in the subgroup can be recovered. In such a case, all data chunks and all parity chunks are marked as available.

If there are still lost data chunks then the next higher hierarchy is examined. However, before this occurs parities from current hierarchy are combined back to parities of higher hierarchy, whenever applicable. In a three-hierarchy basic MPG code, this is the group level. Each group is examined, and a recovery is performed if the number of the lost data chunks is smaller than or equal to the number of available parity chunks in the group. If the data chunks have been recovered, then again all of them as well as all of the parity chunks are marked as available.

If there are still lost data chunks after this step, then recovery is attempted at the next highest level in the hierarchy. In a three-hierarchy MPG code this is the global level. At this top hierarchy, if there is still data chunks marked as lost then the erasure pattern is unrecoverable. If all data chunks are marked as available then the erasure pattern is recoverable. For erasure patterns shown in FIGS. 11 and 13, it is apparent that the basic MPG codes cannot recover all the data chunks as there are insufficient number of parity chunks to protect the associated erasure data chunks. However, as noted above, the generalized MPG codes can be constructed such that the pattern in FIG. 11 is recoverable.

Decoding of the Generalized MPG Codes

Decoding of the generalize MPG codes having the MR property can be performed in at least two ways. First, atomic assignments are used to reverse the encoding process. In an alternate embodiment, a Tanner graph is used for decoding. The following discussion sets forth both of these two decoding methods.

Decoding the Generalized MPG Codes Using Atomic Assignments

The constructed generalized MPG codes having the MR property can be decoded using atomic assignments. In particular, given an erasure pattern e, of which it assumed includes $d_1, \ldots, d_l$ data symbols without loss of generality. It is desired to recover $d_1, \ldots, d_r$ from these data symbols, where them, $r \leq l$. Decoding is to choose a series of symbols $c_1, \ldots, c_p$, which are either parity symbols generated from $d_1$ to $d_m$ or merely these data symbols if available, and form a p×m decoding matrix to recover the r lost data symbols by performing Gaussian elimination. In general, m<k.

Defining a decoding choice as the set of these p symbols, then p is the total number of symbols needed to access in order to recover $d_1, \ldots, d_r$, under this particular decoding choice. The decoding overhead is defined as p−r, or the difference between the number of symbols to access to decode r data symbols and that of accessing them directly if they are not lost.

There are a number of way to recover interested data symbols. One of them is straightforward decoding, which includes first choosing r parity symbols that can recover these lost data symbols and then combining them with the available data symbols to perform the decoding. For example, consider a MPG code with MR property (a generalized MPG code)

under a configuration shown in FIG. 7. If there are 1 erasures in $A_3$ and no erasure elsewhere, one straightforward decoding choice is to utilize the (11,8) MDS code protecting $S_1$. Since 8 symbols need to be accessed to recover one erasure, then the decoding overhead is 7. Another straightforward decoding choice is to read 1 MDS parity symbol in $U_2$ and 8 data symbols to recover the erasure by utilizing the (13,9) MDS code protecting $S_2$. This results in decoding a overhead of 8. The decoding matrix of straightforward decoding is square, or p=m.

Moreover, $A_3$ can be thought as under the protection of (13,6) MDS code. It is possible that the 7 parity symbols from $U_1$ and $U_2$ can be combined to recover the erasure in $A_3$. Additionally, the coefficients corresponding to all other data symbols, except the interested one, cancel each other. If so, then the decoding overhead is 6, which is less than the best of any straightforward recoveries, and the decoding matrix is not square.

Nevertheless, different decoding choices can have different decoding overhead. In a wide range of storage applications, this decoding overhead could mean extra traffic over a large scale network or between multiple servers. This can limit the number of parallel accesses the system can support. Thus, it is desirable for the decoding overhead to be minimized. The decoding choice having the minimum decoding overhead is defined as the optimal decoding choice.

It should be noted that the p×m decoding matrix of the optimal decoding choice is necessarily a full rank square matrix. As such, the case mentioned in paragraph [0102] will not be possible for MPG code with MR property. A proof of this is not presented here, but there are several observations that can be made based on the fact that optimal decoding matrix of MPG codes with MR property must be square and have full rank. First, for every optimal p×p decoding matrix, there must exist a size r matching between $d_1, \ldots, d_r$ to r parity symbols in $c_1, \ldots, c_p$. Hence, this optimal p–r decoding overhead can be also be achieved by choosing these r parity symbols and $d_{r+1}, \ldots, d_p$ to form a decoding matrix. This indicates that any minimum decoding overhead can be achieved by using straightforward decoding.

Second, if the optimal decoding matrix contains parity symbols from $\Lambda(A_h)$, then all data symbols in $A_h$ correspond to $|A_h|$ columns in any optimal decoding matrix, and to zero columns otherwise. This implies two things. First, that all data symbols in $A_h$ either can all be recovered, or none of them can be recovered. Second, that p=m can only be the sum of the sizes of atom sets for the optimal decoding. This is a key point for the decoding technique. Finally, the optimal decoding overhead depends only on $\Omega$. This is because any decoding matrix of MPG codes with MR property has full rank if and only if there exists an atomic assignment, which is determined by configuration.

Let a partial configuration of $\Omega$ be $\Omega' \subseteq \Omega$. Also, let $|\Omega'|$ be the number of data symbols contained in $\Omega'$. Let $e_{\Omega'}$ be the projection of e onto $\Omega'$, containing all erasures belonging to the protection group $S_i \epsilon \Omega'$ or its associating parity group $U_i$. Let $e_0$ be the subset of e that it to be decoded, and containing only data symbols. $\Omega_0$ is defined as the configuration with the minimum size $|\Omega'|$ that satisfies $e_0 \subseteq e_{\Omega'} \epsilon E(\Omega')$.

If $e_0$ is decodable, the optimal decoding matrix for $e_0$ is a square matrix with full rank. The matrix must have $|\Omega_0|$ columns, otherwise $\Omega_0$ can be further reduced. The term $e_{\Omega_0}$ must also be recovered since all data symbols in $\Omega_0$ are recovered.

Therefore, finding the minimum decoding overhead of $e_0$ is equivalent to searching for $\Omega_0$. The problem can be formulated as:

$$\Omega_0 = \mathrm{argmin}_{\Omega' \subseteq \Omega, e_0 \subseteq e_{\Omega'} \epsilon E(\Omega')} |\Omega'|.$$

Given an erasure pattern e, assume it is desired to recover $m_1, \ldots, m_r$ lost data symbols in $A_1, \ldots, A_r$, respectively. In one embodiment, the search for the optimal decoding choice can be described as follows. In general, the idea is to first start with $\Omega'$ with minimum possible $|\Omega'|$, and search over all possible $\Omega'$ by considering more and more protection groups. Those $\Omega'$ whose size is larger than the minimum one observed during the search are pruned out.

Figure 19:
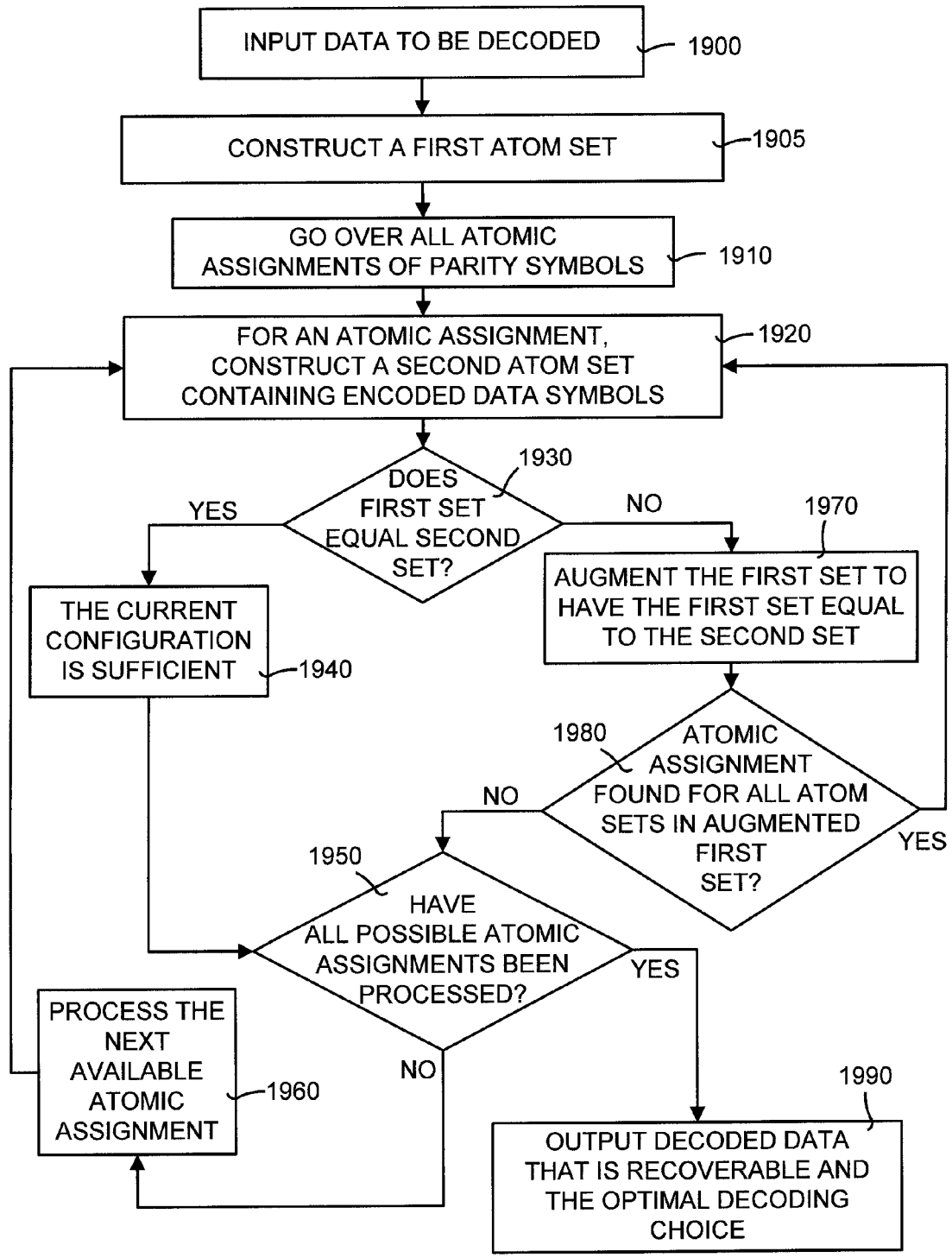
FIG. 19 is a detailed flow diagram illustrating the details of the decoding process for generalized MPG codes having an MR property constructed using an arbitrary method.

FIG. 19 is a detailed flow diagram illustrating the details of the decoding process for generalized MPG codes having an MR property constructed using an arbitrary method. As shown in FIG. 19, data to be decode is input (box 1900). Next, an initial atom set $\Gamma_1 = \{A_1, \ldots, A_r\}$ is constructed (box 1905). Then the process goes over all atomic assignments of parity symbols $\Lambda(U_{i=1, \ldots, r}, A_i)$, to $A_1, \ldots, A_r$ (box 1910). For each of the atomic assignments, the following operations then are performed:

1. Let $\Gamma_2 = \{A_h | A_h$ is protected by assigned parity symbols$\}$ (box 1920). A determination is made whether $\Gamma_1 = \Gamma_2$ (box 1930). If $\Gamma_1 = \Gamma_2$, then decoding can be performed under the current configuration (box 1940), and one candidate of $\Omega_0$ is found. The minimum decoding overhead term w is updated with $\Sigma_{A_x \in \Gamma_1} |A_i| - \Sigma_{i=1}^{r} m_i$ if the later one is smaller. Then a determination is made whether all possible atomic assignments have been processed (box 1950). If not, then the process moves on to the next available atomic assignment (box 1960).

2. If $\Gamma_1 \subset \Gamma_2$, then the process sets $\Gamma_1 = \Gamma_2$ (box 1970) and tries to find an atomic assignment for all atom sets in the augmented $\Gamma_1$ (box 1980). If an assignment is found, then the process repeats step 1. Otherwise, the process determines whether all possible atomic assignments have been processed (box 1950). If not, then the process moves on to the next available atomic assignment (box 1960).

Otherwise, after all possible decoding choices have been attempted, then either the minimum decoding overhead ω is obtained along with the corresponding decoding choice, or the data symbols that are desired to recover are not decodable. The output is the decoded data that is recoverable (box 1990), together with the optimal decoding choice. It should be noted that the above decoding process works for any MPG code with MR property. This is a direct consequence of the fact that the performance of MPG codes with MR property depends only on the configuration.

Finding Minimum Decoding Cost Using a Tanner Graph

It is also possible to find the minimum decoding cost using a Tanner graph. In this alternate embodiment of decoding the generalized MPG codes having a MR property, a Tanner graph to find the minimum cover set. Because each data chunk might be covered by a number of parities in the generalized MPG codes, in the event of failure there could be multiple ways to recover the lost data chunks. This is quite different from the basic MPG codes where decoding should always start from the lowest hierarchy and gradually move up.

A recovery path is defined as a sequence of decoding operations for the generalized MPG codes. In this embodiment, an examination is made of both the minimum read access overhead, which is the minimum recovery path for the access of a single failed data chunk, and the minimum overall recovery cost, which is the minimum recovery path to decode all failed data chunks and to reconstruct all failed parity chunks.

Figures 20, 21:
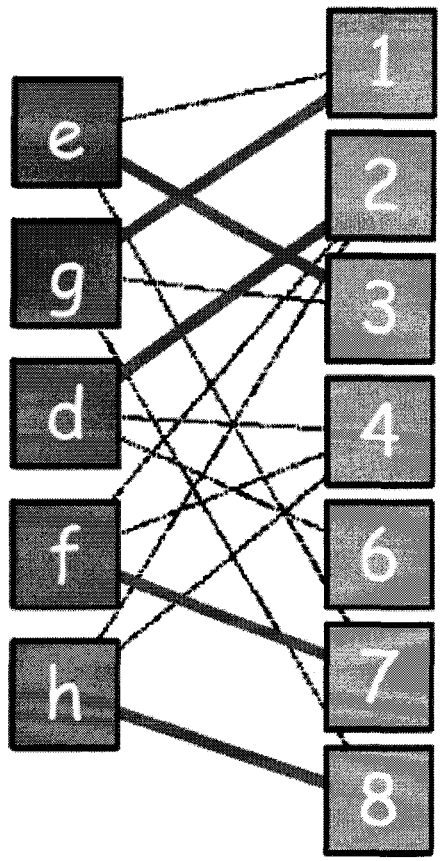
FIG. 20 illustrates in pseudocode an exemplary implementation of finding a minimum recovery cost in the decoding of the generalized MPG codes having an MR property.
FIG. 21 illustrates an example of decoding of a generalize MPG code using a Tanner graph.

Although the proof will not be given here, it can be shown that the minimum recovery path to recover all the erasures (data and parity) should use the same number of parities as the number of data chunks. Moreover, in the MPG codes, the minimum cost to compute a parity chunk equals to the number of its associated data chunks. Using other parities as assistance will not reduce the cost. Using the above facts, it is straightforward to compute the minimum recovery cost. For a given erasure pattern, subsets of parities are select where the size of each subset equals the number of data erasures. If the subset can decode the data erasures (or in other words, a full size matching exists in the Tanner graph), then the recovery (data+parity) cost is computed. After going through all such parity subsets, the minimum recovery cost can be readily derived, as shown in pseudocode in FIG. 20. In practice, the number of parities in the Tanner graph will not be many more than the number of data erasures, so the complexity of the algorithm typically is not high. For instance, FIG. 21 illustrates an example of decoding of a generalize MPG code using a Tanner graph. As shown in FIG. 21, the Tanner graph contains 7 parities and 5 data erasures. This means that there are only $\binom{7}{5}=21$ subsets to compute.

Figure 22:
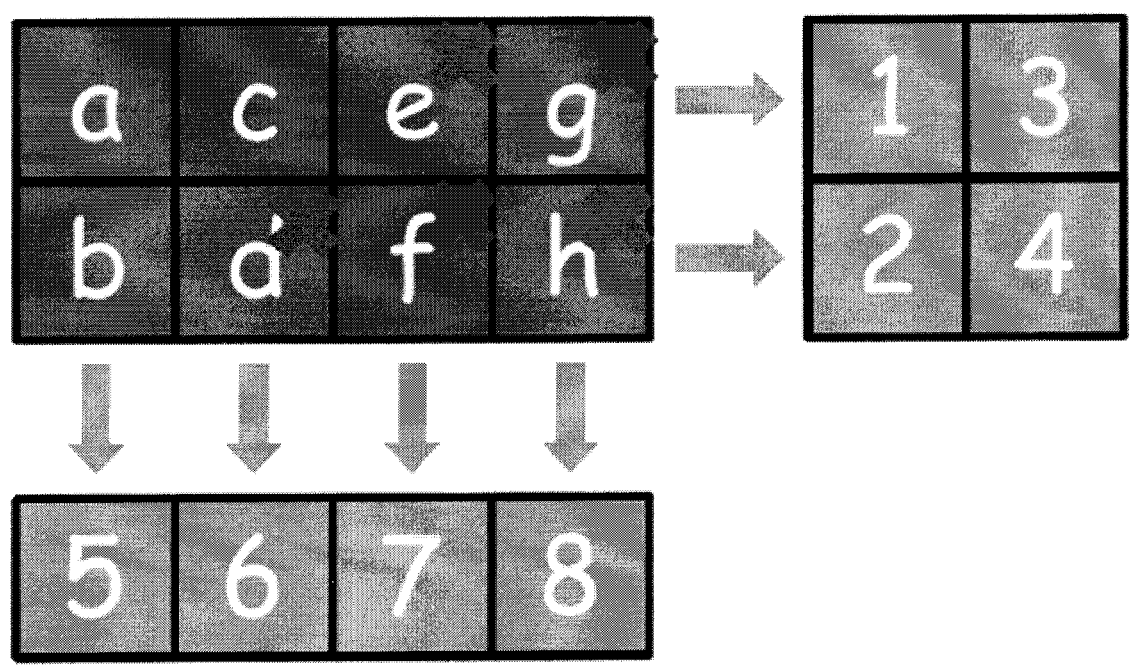
FIG. 22 illustrates an example of an erasure pattern used to find the minimum read access overhead of a particular lost data chunk in the decoding of the generalized MPG codes having an MR property.

Next, the minimum read access overhead of a particular lost data chunk is found. By way of example, FIG. 22 illustrates an example of an erasure pattern, such as the data chunk f having the erasure pattern shown. Note that the recovery of the data chunk f alone may involve fewer reads than those necessary to recover all erasures.

The minimum read access overhead can be computed as follows. Similar to the pseudocode shown in FIG. 20, subsets of parities are selected such that the size of each subset of parities equals to the number of data erasures. Next, a Tanner graph is constructed with the parities and the data erasures. If a full size matching in the Tanner graph cannot be found, then this subset simply is skipped. Otherwise, a breadth first search is performed from the target erasure. If the search encounters a left node (a data erasure) in the Tanner graph, it follows only the link in the matching to the corresponding right node (a parity). If the search encounters a right node, it follows all links in the Tanner graph to all the left nodes, which have not been visited before. Let $V_L$ denote the set of left nodes already visited, $V_R$ the set of right nodes already visited, and $C_L$ the set of all left nodes connected to $V_R$. The search stops when $V_R$ becomes large enough to recover $V_L$ (in other words, $|V_L| \leq |V_R|$ and $C_L \subset V_L$).

FIG. 23 is pseudocode of an exemplary example of computing minimum access cost. After completing all parity subsets, the minimum access cost can be readily derived and its complexity is comparable to the process shown in FIG. 20.

Using the example shown in FIG. 21, when a parity subset with parities {1, 2, 3, 8} is chosen, a full size matching can be found. To access the data chunk f, the breadth first search starts from f, goes to 7, then e, 3, g and stops at 1. It is straightforward to compute that the access cost corresponding to this parity subset is 5.

III. Exemplary Operating Environment

The multiple protection group (MPG) erasure-resilient coding method is designed to operate in a computing environment. The following discussion is intended to provide a brief, general description of a suitable computing environment in which the MPG erasure-resilient coding method may be implemented.

Figure 24:
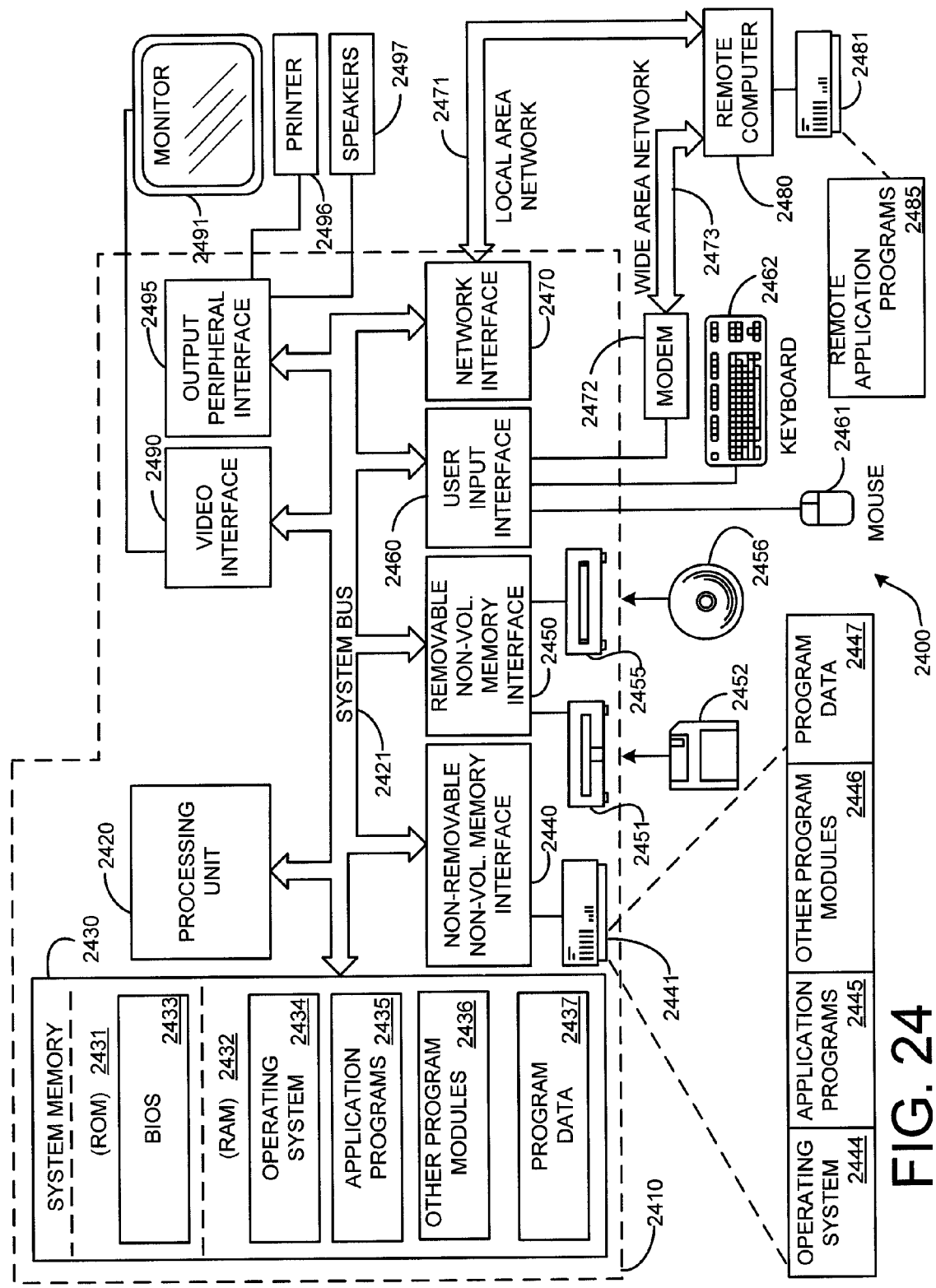
FIG. 24 illustrates an example of a suitable computing system environment in which the multiple protection group (MPG) erasure-resilient coding method may be implemented.

FIG. 24 illustrates an example of a suitable computing system environment in which the MPG erasure-resilient coding method may be implemented. The computing system environment 2400 is only one example of a suitable computing environment and is not intended to suggest any limitation as to the scope of use or functionality of the invention. Neither should the computing environment 2400 be interpreted as having any dependency or requirement relating to any one or combination of components illustrated in the exemplary operating environment.

The MPG erasure-resilient coding method is operational with numerous other general purpose or special purpose computing system environments or configurations. Examples of well known computing systems, environments, and/or configurations that may be suitable for use with the MPG erasure-resilient coding method include, but are not limited to, personal computers, server computers, hand-held, laptop or mobile computer or communications devices such as cell phones and PDA's, multiprocessor systems, microprocessor-based systems, set top boxes, programmable consumer electronics, network PCs, minicomputers, mainframe computers, distributed computing environments that include any of the above systems or devices, and the like.

The MPG erasure-resilient coding method may be described in the general context of computer-executable instructions, such as program modules, being executed by a computer. Generally, program modules include routines, programs, objects, components, data structures, etc., that perform particular tasks or implement particular abstract data types. The MPG erasure-resilient coding method may also be practiced in distributed computing environments where tasks are performed by remote processing devices that are linked through a communications network. In a distributed computing environment, program modules may be located in both local and remote computer storage media including memory storage devices. With reference to FIG. 24, an exemplary system for the MPG erasure-resilient coding method includes a general-purpose computing device in the form of a computer 2410.

Components of the computer 2410 may include, but are not limited to, a processing unit 2420 (such as a central processing unit, CPU), a system memory 2430, and a system bus 2421 that couples various system components including the system memory to the processing unit 2420. The system bus 2421 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The computer 2410 typically includes a variety of computer readable media. Computer readable media can be any available media that can be accessed by the computer 2410 and includes both volatile and nonvolatile media, removable and non-removable media. By way of example, and not limitation, computer readable media may comprise computer storage media and communication media. Computer storage media includes volatile and nonvolatile removable and non-removable media implemented in any method or technology for storage of information such as computer readable instructions, data structures, program modules or other data.

Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computer 2410. Communication media typically embodies computer readable instructions, data structures, program modules or other data in a modulated data signal such as a carrier wave or other transport mechanism and includes any information delivery media.

Note that the term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 2430 includes computer storage media in the form of volatile and/or nonvolatile memory such as read only memory (ROM) 2431 and random access memory (RAM) 2432. A basic input/output system 2433 (BIOS), containing the basic routines that help to transfer information between elements within the computer 2410, such as during start-up, is typically stored in ROM 2431. RAM 2432 typically contains data and/or program modules that are immediately accessible to and/or presently being operated on by processing unit 2420. By way of example, and not limitation, FIG. 24 illustrates operating system 2434, application programs 2435, other program modules 2436, and program data 2437.

The computer 2410 may also include other removable/non-removable, volatile/nonvolatile computer storage media. By way of example only, FIG. 24 illustrates a hard disk drive 2441 that reads from or writes to non-removable, nonvolatile magnetic media, a magnetic disk drive 2451 that reads from or writes to a removable, nonvolatile magnetic disk 2452, and an optical disk drive 2455 that reads from or writes to a removable, nonvolatile optical disk 2456 such as a CD ROM or other optical media.

Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 2441 is typically connected to the system bus 2421 through a non-removable memory interface such as interface 2440, and magnetic disk drive 2451 and optical disk drive 2455 are typically connected to the system bus 2421 by a removable memory interface, such as interface 2450.

The drives and their associated computer storage media discussed above and illustrated in FIG. 24, provide storage of computer readable instructions, data structures, program modules and other data for the computer 2410. In FIG. 24, for example, hard disk drive 2441 is illustrated as storing operating system 2444, application programs 2445, other program modules 2446, and program data 2447. Note that these components can either be the same as or different from operating system 2434, application programs 2435, other program modules 2436, and program data 2437. Operating system 2444, application programs 2445, other program modules 2446, and program data 2447 are given different numbers here to illustrate that, at a minimum, they are different copies. A user may enter commands and information into the computer 2410 through input devices such as a keyboard 2462 and pointing device 2461, commonly referred to as a mouse, trackball or touch pad.

Other input devices (not shown) may include a microphone, joystick, game pad, satellite dish, scanner, radio receiver, or a television or broadcast video receiver, or the like. These and other input devices are often connected to the processing unit 2420 through a user input interface 2460 that is coupled to the system bus 2421, but may be connected by other interface and bus structures, such as, for example, a parallel port, game port or a universal serial bus (USB). A monitor 2491 or other type of display device is also connected to the system bus 2421 via an interface, such as a video interface 2490. In addition to the monitor, computers may also include other peripheral output devices such as speakers 2497 and printer 2496, which may be connected through an output peripheral interface 2495.

The computer 2410 may operate in a networked environment using logical connections to one or more remote computers, such as a remote computer 2480. The remote computer 2480 may be a personal computer, a server, a router, a network PC, a peer device or other common network node, and typically includes many or all of the elements described above relative to the computer 2410, although only a memory storage device 2481 has been illustrated in FIG. 24. The logical connections depicted in FIG. 24 include a local area network (LAN) 2471 and a wide area network (WAN) 2473, but may also include other networks. Such networking environments are commonplace in offices, enterprise-wide computer networks, intranets and the Internet.

When used in a LAN networking environment, the computer 2410 is connected to the LAN 2471 through a network interface or adapter 2470. When used in a WAN networking environment, the computer 2410 typically includes a modem 2472 or other means for establishing communications over the WAN 2473, such as the Internet. The modem 2472, which may be internal or external, may be connected to the system bus 2421 via the user input interface 2460, or other appropriate mechanism. In a networked environment, program modules depicted relative to the computer 2410, or portions thereof, may be stored in the remote memory storage device. By way of example, and not limitation, FIG. 24 illustrates remote application programs 2485 as residing on memory device 2481. It will be appreciated that the network connections shown are exemplary and other means of establishing a communications link between the computers may be used.

The foregoing Detailed Description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A method of constructing a Multiple Protection Group (MPG) code having a Maximally Recoverable (MR) property for coding data having n total chunks, k number of data chunks, and m parity chunks, wherein m=n−k, comprising:

using a computing device to perform the following:
organizing the data chunks into multiple protection groups;
assigning at least one of the m parity chunks to each of the multiple protection groups;

constructing a n×k generator matrix, wherein the generator matrix has n rows and k columns and rank k corresponding to every recoverable erasure pattern;

assigning each row vector of the generator matrix to one of the protection groups;

filling the generator matrix in a deterministic manner; and encoding the data using the constructed MPG code having the MR property.

2. The method of claim 1, wherein filling the generator matrix in a deterministic manner further comprises:

starting from a lock identity matrix and then adding one row at a time to the generator matrix;

defining a $g_m$ row vector as a $(k+m)^{th}$ row of the generator matrix and corresponding to a $m^{th}$ parity chunk;

defining $G_m$ as a truncated generator matrix of a top $(k+i)$ row, wherein i ranges from 1 to k; and identifying a non-zero position of the $g_m$ row vector.

3. The method of claim 2, wherein a $g_m$ row vector corresponding to the $m^{th}$ parity chunk is defined by:

setting the an entry to non-zero for each entry in the generator matrix corresponding to data chunks in a same protection group; and setting the entry equal to zero for each entry in the generator matrix not corresponding to data chunks in a same protection group.

4. The method of claim 2, further comprising constructing a null space matrix that contains null space vectors formed from a submatrix in the truncated generator matrix, wherein the submatrix has rank k−1 and can be combined with the $g_m$ row vector to form a generator submatrix having full rank k.

5. The method of claim 4, further comprising finding a new $g_m$ row vector such that for a null space matrix row vector in the null space matrix the dot product of the null space matrix row vector and the $g_m$ row vector is not equal to zero.

6. The method of claim 5, further comprising finding a row vector such that for every element in the null space matrix the dot product of the element and the row vector is not equal to zero.

7. A computer-implemented process for decoding data encoded using Multiple Protection Group (MPG) code having a Maximally Recoverable (MR) property, comprising:

using the computer to perform the following:

constructing a square decoding matrix having full rank that corresponds to the optimal decoding matrix;

finding an atomic assignment using a configuration that represents a structural relationship between data symbols and parity symbols; and using the atomic assignment and decoding matrix to decode the encoded data.

8. The computer-implemented process of claim 7, further comprising constructing a partial configuration having a minimum possible number of data symbols, wherein the partial configuration is a portion of the configuration.

9. The computer-implemented process of claim 8, further comprising searching over all possible combinations of the partial configuration by taking additional protection groups into consideration.

10. The computer-implemented process of claim 9, further comprising:

constructing an initial set of atom sets by going over all atomic assignments of parity symbols in set of possible parity symbols that can be used to recover erasures in an atom set;

constructing a second set of atom sets containing encoded data symbols that are protected by assign parity symbols;

determining whether the initial set equals the second set;

if so, then concluding that the current configuration is sufficient and decoding the data using the current configuration;

if not, augmenting the initial set equal to have the initial set equal the second set.

determining whether atomic assignments have been found for all atom sets in the augmented initial set;

if so, then repeating the process above; and if not, then processing a next available atomic assignments.

11. A method for decoding data, comprising:

using a computing device to perform the following:

determining that the data was encoded using a Multiple Protection Group (MPG) code having a Maximally Recoverable (MR) property and that there are multiple decoding techniques that may be used to recover failed data chunks of the data; and finding a minimum decoding cost; and selecting a decoding technique from the multiple decoding techniques having the minimum decoding cost to decode the data.

12. The method of claim 11, further comprising using a Tanner graph to find the minimum decoding cost by finding a minimum recovery path for access of a single failed data chunk.

13. The method of claim 12, wherein the minimum recovery path uses the same number of parities and data chunks to recover all failed data chunks and all failed parity chunks.

14. The method of claim 12, further comprising finding a minimum overall recovery cost that corresponds to the minimum recovery path to decode all failed data chunks and to reconstruct all failed parity chunks.

15. The method of claim 14, wherein finding a minimum overall recovery cost further comprises:

finding a plurality of subsets of parities;

selecting a subset of parities for a given erasure pattern such that a size of each subset equals the number of data erasures; and examining each of the plurality of subsets of parities.

16. The method of claim 15, wherein examining each of the plurality of subsets of parities further comprises:

determining whether a full size matching exists in the Tanner graph, wherein a full size matching is a matching having a size equal to a number of failed data chunks corresponding to a number of data nodes in the Tanner graph;

if a full size matching exists in the Tanner graph, then determine a recovery cost of recovering the failed data chunks and the failed parity chunks; and if full size matching does not exists, then skipping the selected subset and selecting another subset.

17. The method of claim 11, further comprising finding a minimum read access overhead of a particular failed data chunk.

18. The method of claim 17, wherein finding a minimum read access overhead further comprises:

performing a breadth search starting at a first node in the Tanner graph;

if the search encounters a left node in the Tanner graph corresponding to a data erasure, then following a link in the matching to a corresponding right node in the Tanner graph.

19. The method of claim 18, further comprising if the search encounters a right node in the Tanner graph, then following a link in the matching to all left nodes in the Tanner graph that have not been visited previously.

20. The method of claim 19, further comprising continuing the search until a set of right nodes already visited become large enough to recover a set of left nodes already visited.

* * * * *